United States Patent [19]

Nishizawa et al.

[11] Patent Number: 5,164,816
[45] Date of Patent: Nov. 17, 1992

[54] INTEGRATED CIRCUIT DEVICE PRODUCED WITH A RESIN LAYER PRODUCED FROM A HEAT-RESISTANT RESIN PASTE

[75] Inventors: Hiroshi Nishizawa; Kenji Suzuki; Yoshiyuki Mukoyama; Tohru Kikuchi; Hidetaka Sato, all of Hitachi, Japan

[73] Assignee: Hitachi Chemical Co., Ltd., Tokyo, Japan

[21] Appl. No.: 739,829

[22] Filed: Aug. 2, 1991

Related U.S. Application Data

[62] Division of Ser. No. 452,520, Dec. 18, 1989, Pat. No. 5,087,658.

[30] Foreign Application Priority Data

Dec. 29, 1988 [JP] Japan .................. 63-333976

[51] Int. Cl.$^5$ .................. H01L 23/48; H01L 29/44; H01L 29/54
[52] U.S. Cl. .................. 257/759; 257/788
[58] Field of Search .................. 357/72, 71, 49, 52; 524/538, 87, 89, 92, 602, 607, 728; 437/195

[56] References Cited

U.S. PATENT DOCUMENTS

| | | | |
|---|---|---|---|
| 4,331,970 | 5/1982 | Yerman | 357/72 |
| 4,495,321 | 1/1985 | Arnold . | |
| 4,499,149 | 12/1985 | Berger | 357/7 |
| 4,540,734 | 9/1985 | Short et al. . | |
| 4,632,798 | 12/1986 | Eickman et al. | 357/72 |
| 4,696,764 | 9/1987 | Yamazaki . | |
| 4,791,157 | 12/1988 | Nishizawa et al. | 524/108 |
| 4,835,197 | 5/1989 | Mercer | 525/436 |
| 5,023,699 | 6/1991 | Hara et al. | 357/72 |
| 5,037,862 | 8/1991 | Nishizawa et al. | 524/514 |

FOREIGN PATENT DOCUMENTS

0034455 8/1981 European Pat. Off. .
0242949 10/1987 European Pat. Off. .
2205571 12/1988 United Kingdom .

OTHER PUBLICATIONS

Mukai; K. et al. "Planar Multilevel Interconnection Technology Employing A Polyimide" IEEE J. of Solid-State Circuits vol. SC-13, No. 4, Aug. 1978, pp. 462-467.

Primary Examiner—Andrew J. James
Assistant Examiner—Sara W. Crane
Attorney, Agent, or Firm—Frishauf, Holtz, Goodman & Woodward

[57] ABSTRACT

An integrated circuit device wherein layer insulation is attained by at least one of (i) an insulator layer interposed between two adjacent conductor layers, and (ii) a surface protecting layer fixedly covering the surface of the semiconductor chip, each of the insulator layer and the surface protecting layer being made of a heat-resistant resin obtainable by heating a heat-resistant resin paste. Said paste consists essentially of a first organic liquid, a second organic liquid, a heat-resistant resin (B) which is soluble in an organic liquid mixture consisting of the first organic liquid and the second organic liquid, and fine particles of a heat-resistant resin (C) which is soluble in the first organic liquid but insoluble in the second organic liquid. The first organic liquid, the second organic liquid and the heat-resistant resin (B) are brought into a solution in which the fine particles of a heat-resistant resin (C) are dispersed.

55 Claims, 3 Drawing Sheets

INTEGRATED CIRCUIT DEVICE PRODUCED WITH A RESIN LAYER PRODUCED FROM A HEAT-RESISTANT RESIN PASTE

This is a division of application Ser. No. 07/452,520, filed Dec. 18, 1989, now U.S. Pat. No. 5,087,658, issued Feb. 11, 1992.

BACKGROUND OF THE INVENTION (a) Industrial Field of the Invention

The present invention relates to a novel heat-resistant resin paste which may be suitably used as an overcoat material for screen process printing and to its use in production of integrated circuit devices.

(b) Description of the Related Art

Generally, resin solutions themselves hardly exhibit thixotropy. Thixotropy is defined as the phenomenon that apparent viscosity of an object decreases temporarily by deformation of the object while the temperature is held constant, and it is a flow property essential to pastes for screen process printing, the viscosities of which are required to temporarily decrease under the high shear rate during printing so as to permit the pastes to flow, but required to return to the original after the pastes are transferred to base materials so as to prevent the pastes from running or flowing. One method of endowing resin solutions with thixotropy is to turn the resin solutions into pastes by dispersing fine particles of resins as fillers in the resin solutions. There are known various such pastes.

Known resin solutions for the usages requiring not so high heat resistance are resin solutions of, for example, rosin-modified phenolic resins, rosin-modified maleic resins, melamine resins, and epoxy resins, and known resin solutions for the usages requiring high heat resistance include resin solutions of highly heat-resistant resins, for example, polyamic acid resins, which are precursors of polyimide resins, and certain polyimide resins, polyamide-imide resins, and polyamide resins which are soluble to solvents. As to the fine particles of resins to be dispersed in these resin solutions to form pastes, known ones for the usages requiring not so high heat resistance include, for example, fine particles of aliphatic polyamide resins, fine particles of melamine resins, fine particles of epoxy resins, and fine particles of phenolic resins, and known ones for the usages requiring high heat resistance include fine particles of highly heat-resistant resins, for example, fine particles of polyimide resins, fine particles of polyamide-imide resins, and fine particles of polyamide resins.

In production of semiconductive devices and wiring boards, insulator layers and surface protecting layers are generally formed by employing a screen process printing technique, and these insulator layers and surface protecting layers require high heat resistance, flexibility, moisture resistance, and corrosion resistance. For such usages, there have been developed screen process printing pastes prepared by dispersing fine particles of inorganic or organic matters as fillers in the above-described highly heat-resistant resin solutions. Inorganic fine particles however damage the flexibility which is innate in resins, because they themselves are hard and occupy large volume percentages in pastes because of their large gravities. Insufficient flexibility tends to cause cracks in films, and inorganic fine particles easily damage the surfaces of semiconductive devices, and therefore, lack reliability, which has been inevitable in insulator layers and protecting layers formed from pastes containing inorganic fine particles.

On the other hand, organic fine particles excelling in flexibility have been under investigation as the particles which may possibly solve the above-described problems. However, when dispersed as fillers in a film, they tend to leave vacant spaces between their surfaces and the resin which serves as an adhesive, thereby directly causing decreases in flexibility, moisture resistance, and corrosion resistance. Such a defect appears more severely in case of pastes prepared by using inorganic fine particles which have poor affinity with resins. Thus, the films formed from the conventional pastes, which have left the fine-particle fillers as they are in the films, have not been uniform and have had a tending to contain vacant spaces regardless of whether the fillers are inorganic fine particles or organic fine particles, and therefore, such films have not been necessarily satisfactory for the usages requiring high flexibility, moisture resistance, and corrosion resistance.

SUMMARY OF THE INVENTION

An object of the present invention is to solve the above-described problems and to provide a heat-resistant resin paste which exhibits thixotropy and can provide films excelling in heat resistance, flexibility, moisture resistance, and corrosion resistance.

Another object of the present invention is to provide integrated circuit devices having insulator layers or surface protecting layers formed from the heat-resistant resin paste.

Accordingly, the present invention provides a heat-resistant resin paste consisting essentially of a first organic liquid ($A_1$), a second organic liquid ($A_2$), a heat-resistant resin (B) which is soluble in an organic liquid mixture consisting of the first organic liquid ($A_1$) and the second organic liquid ($A_2$), and fine particles of a heat-resistant resin (C) which are soluble in the first organic liquid ($A_1$) but insoluble in the second organic liquid ($A_2$), the first organic liquid ($A_1$), the second organic liquid ($A_2$), and the heat-resistant resin (B) being brought into a solution in which the fine particles of a heat-resistant resin (C) are dispersed.

The present invention further provides an integrated circuit device wherein layer insulation is attained by at least one insulator layer interposed between two adjacent conductor layers, the insulator layer being made of a heat-resistant resin obtainable by heating the heat-resistant resin paste of the present invention.

The present invention also provides an integrated circuit device wherein surface protection of semiconductor chip is attained by a surface protecting layer fixedly covering the surface of the semiconductor chip, the surface protecting layer being made of a heat-resistant resin obtainable by heating the heat-resistant resin paste of the present invention.

Further, the present invention provides an integrated circuit device wherein layer insulation is attained by at least one insulator layer interposed between two adjacent conductor layers, and surface protection of semiconductor chip is attained by a surface protecting layer fixedly covering the surface of the semiconductor chip, each of the insulator layer and the surface protecting layer being made of a heat-resistant resin obtainable by heating the heat-resistant resin paste of the present invention.

The heat-resistant resin paste of the present invention is composed essentially of a solution consisting of the first organic liquid ($A_1$), the second organic liquid ($A_2$), and the heat-resistant resin (B), which functions mainly as a binder, and the fine particles of a heat-resistant resin (C), which function mainly to endow the paste with thixotropy. In the heat-resistant resin paste, the surfaces of the fine particles (C) may be somewhat dissolved in ($A_1$) as far as the fine particles remain dispersed in the paste without fusing together or cohering together. The organic liquids ($A_1$) and ($A_2$) are liquids able to be evaporated. The fine particles of a heat-resistant resin (C) in the blended heat-resistant resin paste of the present invention remain dispersed in the solution consisting of ($A_1$), ($A_2$), and (B) and endow the paste with thixotropy, and when heated, the fine particles (C) dissolve in ($A_1$), and finally formed is a uniform film in which (C) and (B) are uniformly dissolved. That is, in the heat-resistant resin paste, the existence of ($A_2$) prevents (C) from dissolving in ($A_1$). When the heat-resistant resin paste is heated, the heating makes ($A_1$) and ($A_2$) begin to evaporate, and at the same time it makes it easy for (C) to dissolve in ($A_1$) even if a small quantity of ($A_2$) still remains, and thus (C) is mixed with (B). As the heating is continued, ($A_1$) and ($A_2$) continue to evaporate out from the paste, and finally, only (B) and (C) remain in a state mixed uniformly with each other to form by themselves an uniform resin film on the surface of or between layers of an integrated circuit device or the like to which the heat-resistant resin paste was applied. So the heat-resistant resin paste of the present invention has excellent thixotropy which directly affect the printing efficiency, and the resulting film is a uniform one without a pin hole nor a vacant space, ensuring excellent flexibility, moisture resistance, and corrosion resistance. It is preferable that ($A_2$) is easier to evaporate than ($A_1$). When ($A_2$) is harder to evaporate than ($A_1$), (C) remains in the resin film in the original form of fine particles failing in providing a uniform film.

DESCRIPTION OF THE PREFERRED EMBODIMENTS

Figure 1:
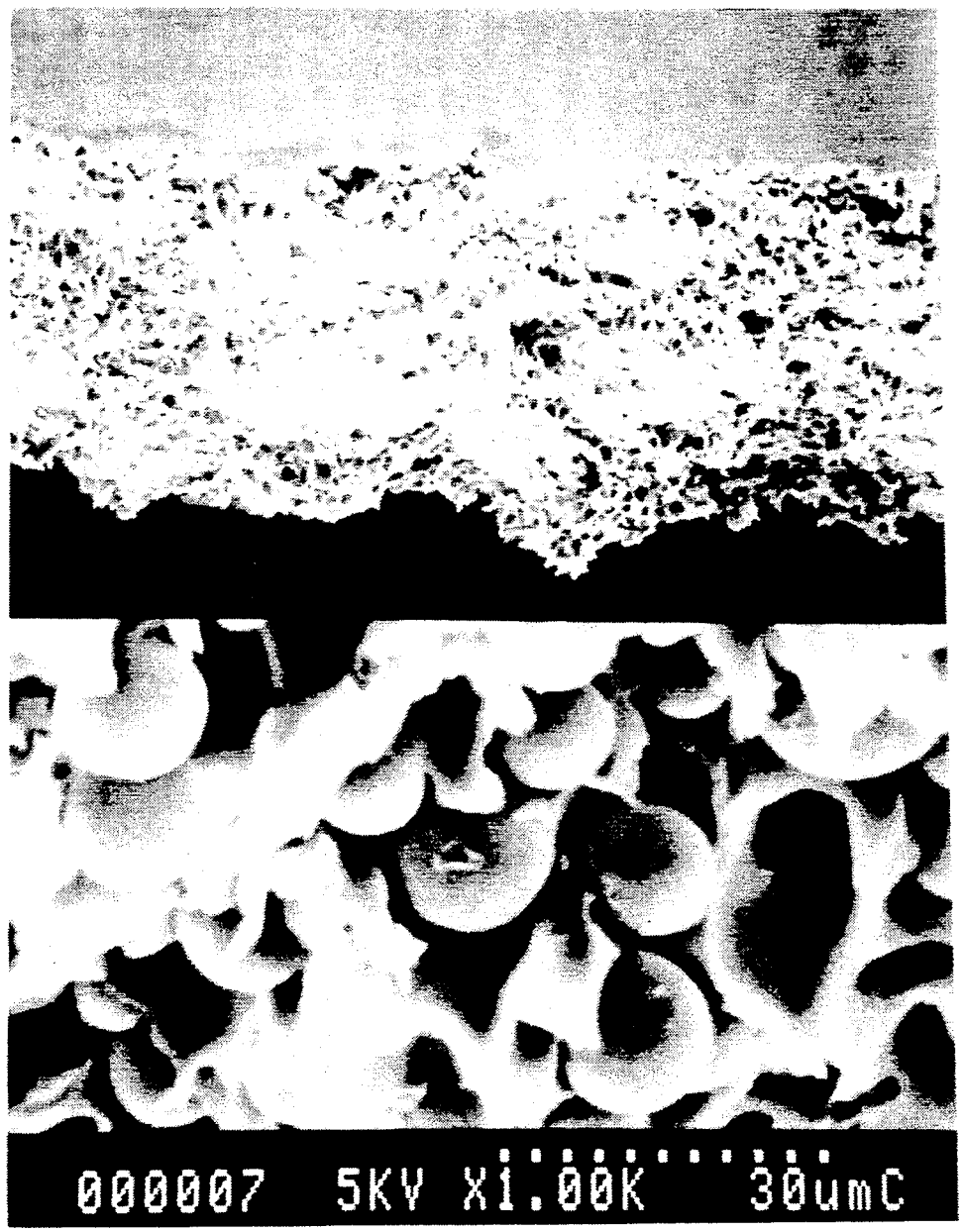
FIG. 1 is a scanning electron micrograph showing an enlarged cross section of the film formed from the paste of Comparative Example 2.

The first organic liquid ($A_1$) to be used in the present invention, together with the second organic liquid ($A_2$), dissolves the heat-resistant resin (B) soluble in an organic liquid mixture consisting of the ($A_1$) and ($A_2$), and also dissolves by itself the fine particles of a heat-resistant resin (C). It is preferably to use ($A_1$) which is harder to evaporate out from the paste than ($A_2$) and is also a good solvent to (B).

The second organic liquid ($A_2$) to be used in the present invention, together with the first organic liquid ($A_1$), dissolves the heat-resistant resin (b) (hereinafter, (B) will sometimes be referred to as soluble, heat-resistant resin (B).) soluble in an organic liquid mixture consisting of the ($A_1$) and ($A_2$), but does not dissolve by itself the fine particles of a heat-resistant resin (C) (hereinafter, (C) will sometimes be referred to as fine particles of an insoluble heat-resistant resin). It is preferable to use ($A_2$) which is easier to evaporate out from the paste than ($A_1$) and is also a good solvent or a poor solvent to (B).

The easiness in evaporating ($A_1$) and ($A_2$) out from the paste depends on the boiling points, the vapor pressures, and the degrees of affinity of ($A_1$) and ($A_2$) with (B) and (C).

Generally, the lower boiling point, the higher vapor pressure, and the poorer affinity with the resins the organic liquid has, the more easily it is evaporated out from the paste.

In the present invention, the concrete combination of ($A_1$) and ($A_2$) varies depending on the kinds of (B) and (C) used, and any combination may be chosen as far as a paste directed by the present invention can be obtained. Some concrete examples of the organic liquids ($A_1$) and ($A_2$) include the organic liquids described in "Solvent Handbook" (published by Kodansha in 1976) on pages 143 to 852. Some typical examples which may be used include nitrogen containing compounds, such as N-methylpyrrolidone, dimethylacetamide, dimethylformamide, 1,3-dimethyl-3,4,5,6-tetrahydro-2(1H)-pyrimidinone, and 1,3-dimethyl-2-imidazolidinone; sulfur compounds, such as sulfolane and dimethyl sulfoxide; lactones, such as γ-butyrolactone, γ-caprolactone, α-butyrolactone, and ε-caprolactone; ethers, such as dioxane, 1,2-dimethoxyethane, diethylene glycol dimethyl (or diethyl, dipropyl or dibutyl) ether, triethylene glycol dimethyl (or diethyl, dipropyl or dibutyl) ether, and tetraethylene glycol dimethyl (or diethyl, dipropyl or dibutyl) ether; ketones, such as methyl ethyl ketone, methyl isobutyl ketone, cyclohexanone, and acetophenone; alcohols, such as butanol, octyl alcohol, ethylene glycol, glycerin, diethylene glycol monomethyl (or monoethyl) ether, triethylene glycol monomethyl (or monoethyl) ether, and tetraethylene glycol monomethyl (or monoethyl) ether; phenols, such as phenol, cresol, and xylenol; esters, such as ethyl acetate, butyl acetate, ethyl cellosolve acetate, and butyl cellosolve acetate; hydrocarbons, such as toluene, xylene, diethylbenzene, and cyclohexane; halogenized hydrocarbons, such as trichloroethane, tetrachloroethane, and monochlorobenzene.

Each of ($A_1$) and ($A_2$) may also be used in combination of two or more kinds of them, respectively.

The heat-resistant resin (B) soluble in an organic liquid mixture consisting of the first organic liquid ($A_1$) and the second organic liquid ($A_2$) may be either a thermosetting resin or a thermoplastic resin. Some examples of the thermosetting, soluble, heat-resistant resin which may be used include addition-polymerization polyimide resins, such as acetylene-terminated polyimide resins, maleimide-terminated polyimide resins, norbornane-terminated polyimide resins, BT resins (produced by MITSUBISHI GAS CHEMICAL CO., INC., trade name), and KERIMID (produced by Rhone-Poulenc S. A., trade name); melamine resins;

phenolic resins; and epoxy resins. Some examples of the thermoplastic, soluble, heat-resistant resin which may be used include the soluble heat-resistant resins described in "Plastic Handbook" (published by Asakura Shobo in 1979) on pages 308 to 618. From the viewpoints of heat resistance and solubility, the preferred are polyamide resins, polyamide-imide resins, and polyimide resins (including polyamic acid resins which are precursors of the polyimide resins). Herein, the polyamide resins also include those containing, in addition to amide bonds, ether bonds, ester bonds or both ether bonds and ester bonds and various precursors thereof, and polyamide-imide resins also include those containing, in addition to amide bonds and imide bonds, ether bonds, ester bonds or both ether bonds and ester bonds and various precursors thereof, and polyimide resins include those containing, in addition to imide bonds, ether bonds, ester bonds or both ether bonds and ester bonds and various precursors thereof.

Illustrative examples of the precursors of polyimide resins are compositions or polyamic acid ester oligomers which respectively are products of mixing or reaction of diamines with tetracarboxylic acid esters obtained from the reaction of tetracarboxylic acid dianhydrides with alcohols, derivatives of alcohols or mixtures thereof.

Other examples of the precursors of the polyimide resins are compositions or polyamic acid oligomers which respectively are products of mixing or reaction of diamines with complexes obtained from the reaction of a tetracarboxylic acid dianhydrides with solvents capable of forming complexes together with the tetracarboxylic acid dianhydrides. The preferred examples of the solvents include N-methylpyrrolidone, pyridine, and $\epsilon$-caprolactam.

Typical examples of the polyamide resins, polyamide-imide resins, and polyimide resins which may be used include products of reaction of polycarboxylic acids or reactive derivatives thereof with diamines (for example, those described in Japanese Patent Application Kokai Koho (Laid-open) No. 63-205640) or diisocyanates obtainable from the reaction of the diamines with phosgene or thionyl chloride. Some concrete examples include soluble polyamide resins disclosed in Japanese Patent Application Kokai Koho (Laid-open) No. 57-64955, soluble polyamide-imide resins disclosed in Japanese Patent Application Kokai Koho (Laid-open) No. 1-40570, and soluble polyimide resins disclosed in Japanese Patent Application Kokai Koho (Laid-open) No. 62-283154.

Considering the ability of bringing good film-forming property to pastes and good flexibility to final films, the preferred thermoplastic, soluble, heat-resistant resins (B) have reduced viscosities of at least 0.3 as measured in dimethylformamide solvent at a concentration of 0.5 g/dl and at a temperature of 30° C. Also, the soluble, heat-resistant resins (B) preferably have temperatures for the onset of heat decomposition of 250° C. or higher, more preferably 350° C. or higher. The soluble, heat-resistant resins (B) may be used individually or in a mixture of two or more of them.

Examples of the fine particles of a heat-resistant resin (C) to be used in the present invention, which are soluble in the first organic liquid ($A_1$), but insoluble in the second organic liquid ($A_2$) and are dispersed in the solution consisting of ($A_1$), ($A_2$), and the soluble, heat-resistant resin (B), are fine particles of a heat-resistant resin selected from the above-described soluble, heat-resistant resins (B). Fine particles of the above-described polyamide resins, polyamide-imide resins, and polyimide resins (including polyamic acid resins which are precursors of the polyimide resins) are preferably used because of their high heat-resistance and good solubility in the first organic liquid ($A_1$). Considering the easiness and low cost in preparation of fine particles and the ability of bringing thixotropy to pastes, particularly preferred are fine particles of polyamide resins, polyamide-imide resins, and polyimide resins which are prepared by a non-aqueous dispersion polymerization (for example, the method disclosed in Japanese Patent Application Kokoku Koho (Publication) No. 60-48531 and Japanese Patent Application Kokai Koho (Laid-open) No. 59-230018) and have an average particle size of 40 $\mu$m or less. In case the paste of the present invention is used for screen process printing, it is preferable to use fine particles of heat-resistant resin (C) having an average particle size of from 0.1 to 5 $\mu$m in order to strike a balance between the thixotropy of a paste and thickness and uniformity of the final film. Such fine particles of a heat-resistant resin (C) are obtainable by employing the above-described non-aqueous dispersion polymerization.

In addition to the above-described non-aqueous dispersion polymerization, the fine particles of a heat-resistant resin (C) may also be prepared by any other method, for example, a method where a powdery resin recovered from a resin solution is mechanically ground, a method where a high shear stress if applied on a resin solution while a poor solvent is added therein, to separate the resin and grind the separated resin by the high shear into fine particles, and a method where sprayed oily drops of a resin solution are dried to obtain fine particles.

In case fine particles of a thermoplastic, heat-resistant resin (C) is used, it is preferable to use a resin having a reduced viscosity of at least 0.3 because such fine particles can bring a good film-forming property to pastes and good flexibility to the final films.

It is preferable to use fine particles of thermosetting or thermoplastic, heat-resistant resins (C) having temperatures for onset of heat decomposition of 250° C. or more, particularly preferably 350° C. or more. It is possible to use fine particles of one kind of resin or fine particles of two or more kinds of resins.

The particularly preferred embodiments of the heat-resistant resin paste according to the present invention will be described below.

Firstly, the combinations of the first organic liquid ($A_1$) and the second organic liquid ($A_2$) may be classified, for example, into the following two types, (a) and (b).

(a) combinations of at least one kind of ($A_1$) selected from the above-described nitrogen containing compounds such as N-methylpyrrolidone, dimethylacetamide, and 1,3-dimethyl-2-imidazolidinone, sulfur compounds such as dimethylsulfoxide, lactones such as $\gamma$-butyrolactone, and phenols such as xylenol and at least one kind of ($A_2$) selected from the above-described ethers such as dioxane, diethylene glycol dimethyl ether, and triethylene glycol dimethyl ether, ketones such as cyclohexanone, esters such as butyl cellosolve acetate, alcohols such as butanol, and hydrocarbons such as xylene and (b) combinations of at least one kind of ($A_1$) selected from the above-described ethers such as tetraethylene glycol dimethyl ether and ketones such as cyclohexanone and at least one kind of (A₂) selected from the above-described esters such as butyl cellosolve acetate and ethyl acetate, alcohols such as butanol and methyl carbitol, and hydrocarbons such as xylene.

Examples of the soluble, heat-resistant resin (B) and the fine particles of a heat-resistant resin (C) which are applicable to the organic liquid mixture of the combination (a) include the following.

Some examples of (B) applicable to the organic liquid mixture of the combination (a) include the heat-resistant resins each having the following repeating units represented respectively by the following formulas (1) to (10).

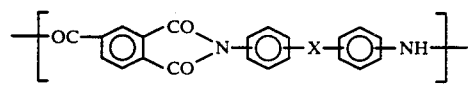 (1)

wherein
X is —CH₂—, —O—, —CO—, —SO₂—,

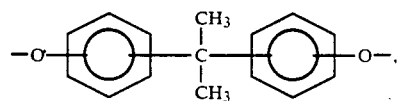

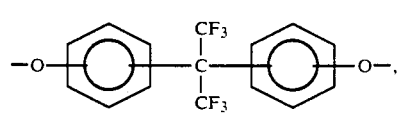

-continued

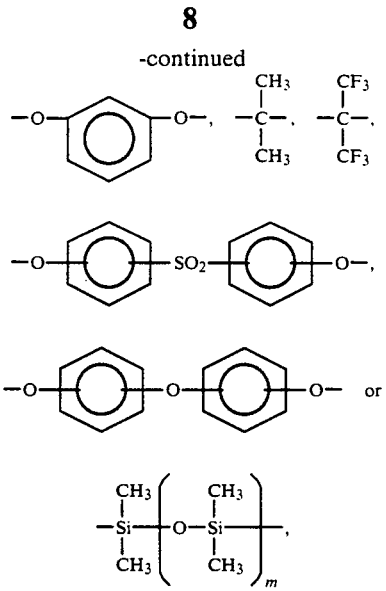

m being an integer having a value of from 1 to 100.

In the following formulas, X has the same meaning as defined above.

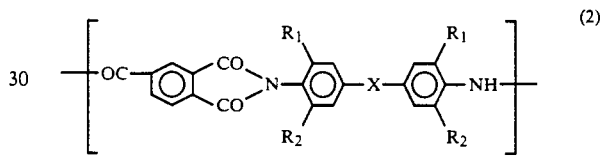 (2)

wherein each R₁ and each R₂ are independently hydrogen or a hydrocarbon group of 1 to 6 carbon atoms.

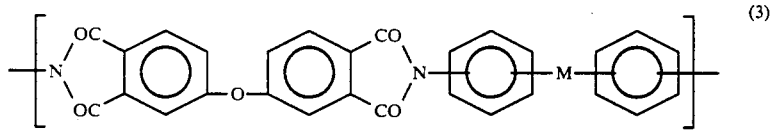 (3)

wherein

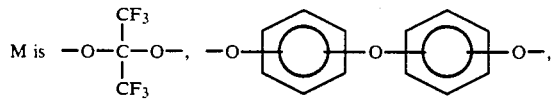

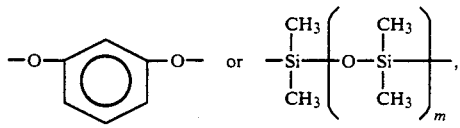

m being an integer having a value of from 1 to 100.

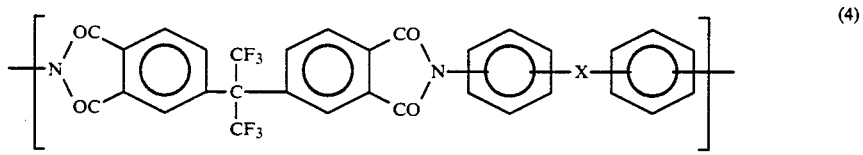 (4)

-continued

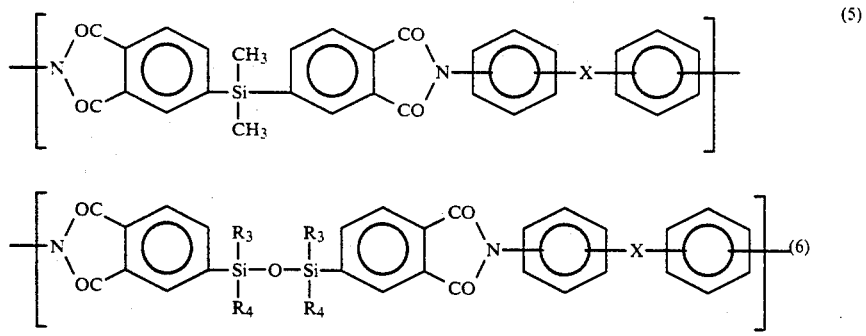

wherein
each $R_3$ and each $R_4$ are independently methyl, ethyl, propyl or phenyl.

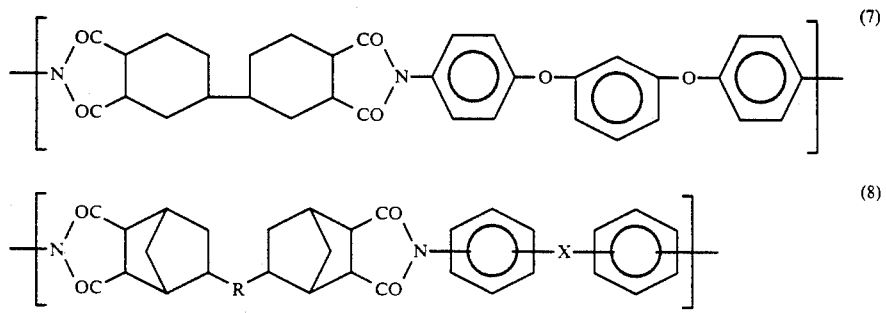

wherein
R is —S— or —$SO_2$—

Some examples of (C) applicable to the organic liquid mixture of the combination (a) include the fine particles of the heat-resistant resins each having the repeating units represented respectively by the following formulas (11) to (19).

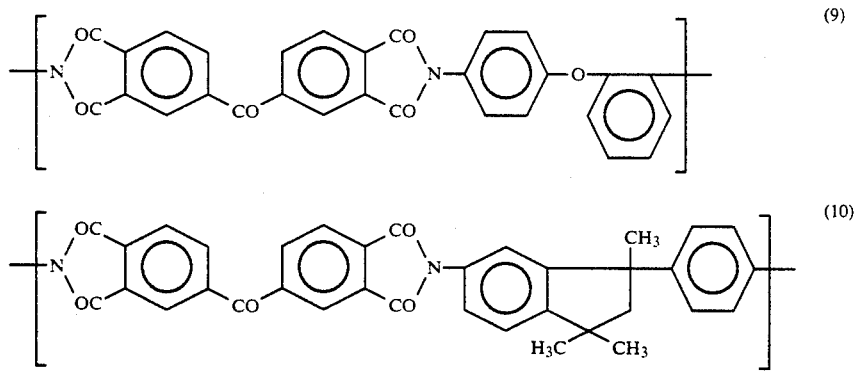

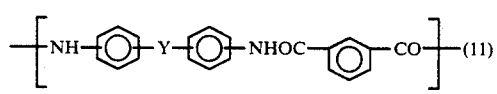

wherein

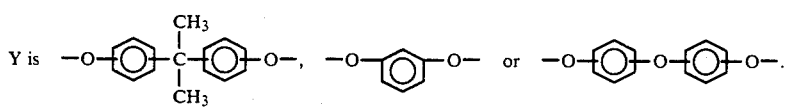

(In the following formulas, Y has the same meaning as described above.)

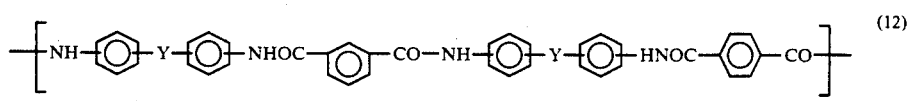

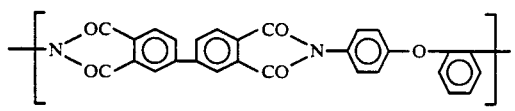 (13)

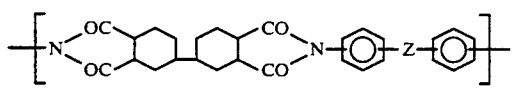 (14)

wherein

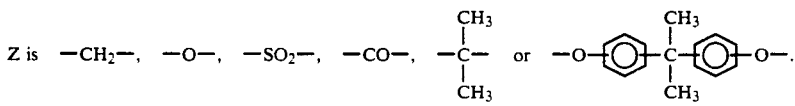

(In the following formulas, Z has the same meaning as described above.)

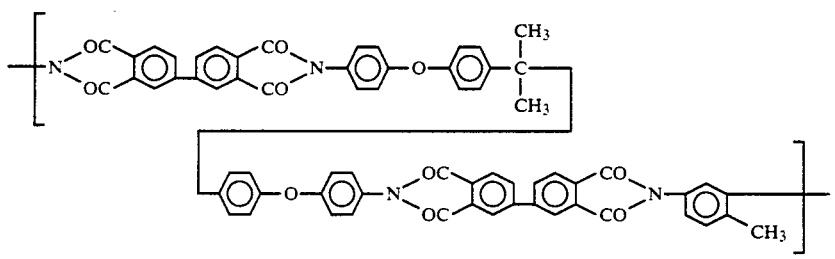 (15)

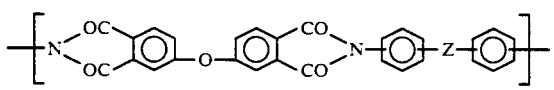 (16)

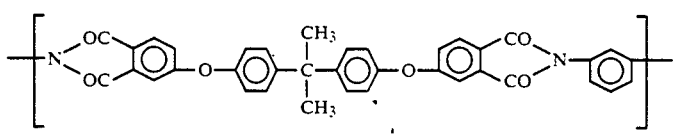 (17)

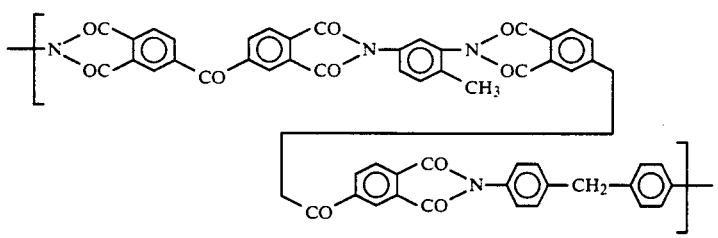 (18)

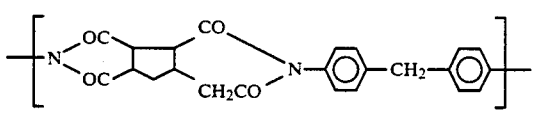 (19)

Examples of (B) and (C) applicable to the above-described of organic liquid mixture of the combination (b) include the followings.

Firstly, examples of (B) applicable to the of organic liquid mixture of the combination (b) include the heat-resistant resins each having the repeating units represented respectively by the following formula (20) and (21) and the polysiloxaneimide represented by the above formula (6).

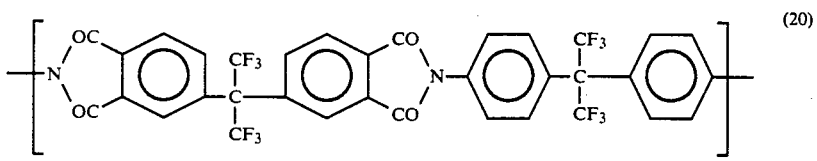 (20)

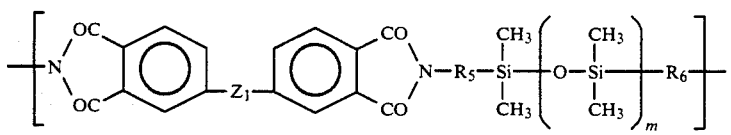
(21)

wherein

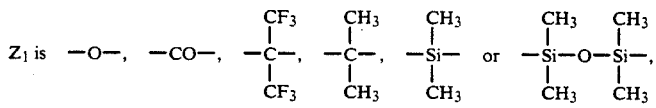

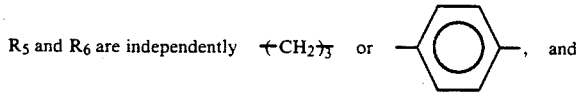, and m is an integer having a value of from 1 to 100.

Examples of (C) applicable to the of organic liquid mixture of the combination (b) include the polyetheramide-imide having the repeating units represented by the formula (1) wherein X is

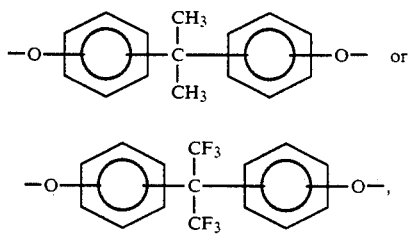

and the above-described polyimides each having the repeating units represented by the formulas (5) to (9), with the proviso that those wherein in the formulas (5), (6), and (8), X is

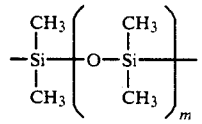

are excluded.

Each of the above-described examples of the resins (B) and (C) may also have two or more kinds of the repeating units represented by the above formulas (1) to (21).

($A_1$) and ($A_2$) are used preferably in the ratio ranging from 30($A_1$):70($A_2$) to 70($A_1$):30($A_2$) in parts by weight when the sum of ($A_1$) and ($A_2$) is 100 parts by weight, the film-forming property of (C) may sometimes be deteriorated, and if it exceeds 70 parts by weight, (C) may become apt to dissolve in the solution consisting of ($A_1$), ($A_2$), and (B), and it may become hard for (C) to disperse in the paste.

($A_1$) and ($A_2$) preferably have boiling points of 100° C. or higher, in consideration of the usable pot life of the paste during screen process printing.

The concentrations of (C) and (B) in the paste are preferably adjusted so that the paste has a viscosity of from 30 to 10,000 poise and a thixotropy index of at least 1.5. If the viscosity of the paste is less than 30 poise, the printed paste may tend to run, and if it exceeds 10,000 poise, the working efficiency of printing may be decreased. The particularly preferable range of the viscosity of the paste is from 300 to 5,000 poise.

It is preferable to use from 5 to 70 parts by weight of (B) per from 95 to 30 parts by weight of (C) with the proviso the total of (B) and (C) used is 100 parts by weight.

The thixotropy index of paste is the ratio of $\eta_1$ to $\eta_{10}$, i.e. the $\eta_1/\eta_{10}$ value, $\eta_1$ and $\eta_{10}$ being the apparent viscosities of a paste measured by employing a E-type viscometer (produced by Tokyo Keiki Co., Ltd., EHD-U type) under the condition of the sample amount of 0.4 g and the measuring temperature of 25° C. for both and the revolution speeds of 1 rpm and 10 rpm respectively.

The concentration of the sum total of (C) and (B) in the paste of the present invention is preferably 10 to 90% by weight. If it is less than 10% by weight, it may become hard to make the dry film thickness large, and if it exceeds 90% by weight, the paste may become poor in flowability.

The dry film thickness and flexibility of the film formed from the paste of the present invention varies depending on whether (B) and (C) used are thermosetting resin or thermoplastic resin. Because thermosetting resins generally have relatively low molecular weights and excel in solubility, the use of (B) of thermosetting type permits increasing the concentration of the (B) in paste, resulting in an increase in the dry film thickness.

However, cured thermosetting resins are generally considerably poor in flexibility. On the other hand, thermoplastic resins exhibit characteristics contrary to those of thermosetting resins in solubility and flexibility. Therefore, one of the desirable combinations of (B) and (C) consists of (B) of thermosetting resin and (C) of thermoplastic resin. Examples of such a desirable combination are the combinations of (B) and (C) employed in the following Examples 5 and 6.

The method of dispersing (C) in the solution consisting of ($A_1$), ($A_2$), and (B) may be any method generally employed in the paint industry, for example, roll kneading and mixer kneading, and there is no particular restriction as far as sufficient dispersion can be ensured. The most preferable method is a repetition of kneading with a three-roll mixing mill.

The paste of the present invention preferably has a thixotropy index of 1.5 or more. If the thixotropy index is less than 1.5, the paste tends to run after transferred to a base material causing difficulty in attaining sufficient pattern accuracy.

After applied on a base material, the paste of the present invention is heated preferably at 150° to 500° C. for 1 to 120 minutes to form a strong film.

The paste of the present invention may further contain additives such as antifoaming agents, pigments, dyestuffs, plasticizers, and antioxidants, according to demand.

The heat-resistant resin paste of the present invention can be used widely to form insulator layers for layer insulation or surface protecting layers for surface protection in, for example, monolithic integrated circuit devices the substrates of which are silicon wafers, hybrid integrated circuit devices, thermal heads, image censers, and multichip high density mounting boards the substrates of which are ceramic substrates or glass substrates, and various wiring boards such as flexible wiring boards and rigid wiring boards; various heat-resistant printing inks; and heat-resistant adhesives; and are therefore very useful in various industrial fields.

When the heat-resistant resin paste of the present invention is used to form surface protecting layers of semiconductor substrates such as semiconductor chips of monolithic integrated circuit devices, it is desirable to lessen the amount of α-ray source materials contained in the surface protecting layers, such as uranium and thorium, and the amount of ionizable impurities contained in the surface protecting layers, such as sodium, potassium, copper, and iron. The total amount of α-ray source materials such as uranium and thorium is preferably 1 ppb or less, more preferably 0.2 ppb or less. The reason is that from a turn at 0.2 to 1 ppb to the lesser side, there is observed a sharp decrease in the bad effect of α-rays irradiated from surface protecting layers which causes malfunction of devices. In case there is a possibility that the total content of α-ray source materials such as uranium and thorium exceeds the range of 0.2 to 1 ppb in a surface protecting layer, the total content of α-ray source materials such as uranium and thorium can be reduced by purifying materials to be used for preparation of the paste, for example, the monomers and solvents to be used for preparation of the above-described resins (B) and (C), the precipitants to be used for purifying the resins, and the organic liquids ($A_1$) and ($A_2$). For example, the purification can be conveniently performed by distillation, sublimation, recrystallization or extraction of the monomers and solvents to be used for preparation of the resins (B) and (C), the precipitants to be used for purifying the resins, and the organic liquid ($A_1$) and ($A_2$), and further, by repeating the precipitation process of the synthesized resin solution in a purified poor solvent.

In order to reduce corrosion or leak in semiconductor substrates having the surface protecting layers formed from the paste of the present invention, it is also preferable that the total content of ionizable impurities contained in the surface protecting layers, such as sodium, potassium, copper, and iron in surface protecting layers is not more than 2 ppm, more preferably not more than 1 ppm. In case there is a possibility that the total content of ionizable impurities exceeds the range of 1 to 2 ppm in a surface protecting layer, the total content of ionizable impurities can be reduced by purifying the above-described monomers etc. to be used for preparation of the resins (B) and (C), in the same manner as the purification processes described above. Purification need not be carried out on all the above-described materials such as monomers. For example, purification may be carried out only on monomers or only on monomers and solvents.

Some examples of the integrated circuit devices of the present invention include monolithic integrated circuit devices, hybrid integrated circuit devices, and multichip high density mounting boards, wherein the heat-resistant resin paste of the present invention is used to form surface protecting layers for surface protection or insulator layers for layer insulation in layered wiring.

Figure 3:
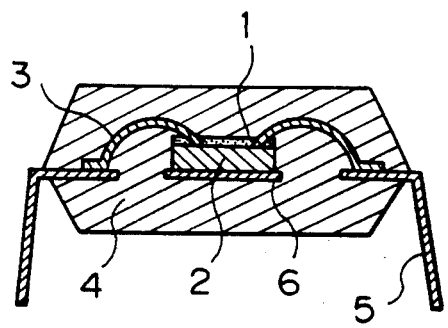
FIG. 3 is a sectional view illustrating a monolithic integrated circuit device which is an embodiment of the integrated circuit device according to the present invention.

In the monolithic integrated circuit device according to the present invention, one surface of the semiconductor chip packaged in the device is fixed to a support, and the reverse surface is covered with a surface protecting layer which is a heat-resistant resin film formed by applying the heat-resistant resin paste of the present invention and then heating the applied layer. An embodiment of the monolithic integrated circuit device according to the present invention has the structure as shown in FIG. 3, in a sectional view, wherein a large scale integration (LSI) chip 2 (i.e., a semiconductor chip), one surface of which is fixed to a support 6 and the other surface of which is covered with a heat-resistant resin layer 1 (i.e., a surface protecting layer) formed by applying the heat-resistant resin paste of the present invention and then heating the applied layer, is packaged in a resin package 4 of saturation type, and downwardly bent leads 5 are led out of the resin package 4 with their ends in the package 4 connected to the LSI chip 2 by bonding wires 3.

Figure 4:
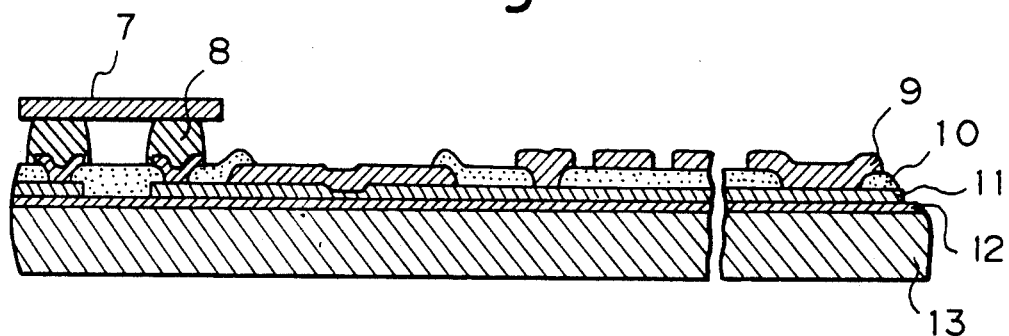
FIG. 4 is a partially sectional view illustrating a hybrid integrated circuit device which is an embodiment of the integrated circuit device according to the present invention.

In the hybrid integrated circuit device according to the present invention, the heat-resistant resin paste of the present invention is used, for example, for forming at least one insulator layer in its film integrated circuit. That is, the insulator layer is a patterned heat-resistant resin layer formed by using the heat-resistant resin paste and is interposed between two adjacent patterned conductor layers so as to insulate the two conductor layers at predetermined areas. An embodiment of the hybrid integrated circuit device according to the present invention has the structure as shown in FIG. 4, in a partially sectional view, wherein on an alumina support 13 (i.e. an insulating support) supported are a resistor layer 12, a first conductor layer 11, and a second conductor layer 9 one after another to construct a film integrated circuit in the device, the first and second conductor layers 11 and 9 being insulated from each other at predetermined areas by a patterned heat-resistant resin layer (i.e., an insulator layer) 10, which is formed by applying the heat-resistant resin paste of the present invention on the first conductor layer 11 followed by heating to form the patterned heat-resistant resin layer 10, and on which the second conductor layer 9 is then formed, and a diode chip 7 (i.e., a semiconductor chip) is mounted on the film integrated circuit with connecting solder parts 8 interposed in between the diode chip 7 and the film integrated circuit.

Figure 5:
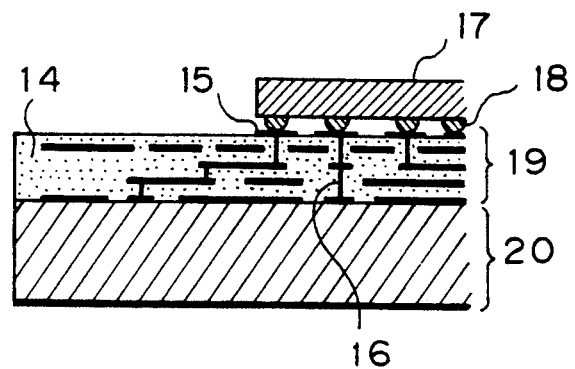
FIG. 5 is a partially sectional view illustrating a multichip high density mounting board which is an embodiment of the integrated circuit device according to the present invention.

In the multichip high density mounting board according to the present invention, the heat-resistant resin paste of the present invention is used for forming a conducting material/heat-resistant resin multilayer wiring layer which is formed on and adhered fixedly to a multilayer ceramic wiring board. The conducting material/heat-resistant resin multilayer wiring layer may be prepared by repeating, on the multilayer ceramic wiring board, formation of a conductor layer through any known technique and formation of a heat-resistant resin layer (insulator layer) by applying the heat-resistant resin paste of the present invention on the formed conductor layer followed by heating the applied layer. An embodiment of the multichip high density mounting board according to the present invention is shown, in a partially sectional view, in FIG. 5, in which on a multilayer ceramic wiring board 20 formed is a copper/heat-resistant resin multilayer wiring layer 19 which consists of heat-resistant resin layers 14 (i.e. an insulator layer), patterned copper-conductor layers 15, and connecting conductors 16 for connecting the patterned copper-conductor layers to form a predetermined wiring circuit, and LSI chips 17 (i.e. semiconductor chips) are mounted on the copper/heat-resistant resin multilayer wiring layer 19 with connecting solder parts 18 interposed in between the LSI chips 17 and the multilayer wiring layer 19.

EXAMPLES

COMPARATIVE EXAMPLE 1

(1) Preparation of a heat-resistant resin

| Components | (gram) | (mol) |
|---|---|---|
| Trimellitic anhydride | 192.0 | 1.00 |
| 2,2-bis[4-(4-aminophenoxy)phenyl]propane | 414.1 | 1.01 |
| N-methylpyrrolidone | 606 | |
| Aqueous solution of phosphoric acid (phosphoric acid content: 85% by weight) | 5.9 | 0.06 |

Into a four-neck flask equipped with a thermometer, a stirrer, a nitrogen introducing tube, and a water separator charged were the above components with stirring, and the mixture was heated to 160° C. while gaseous nitrogen was passed through the mixture. The temperature was raised slowly to 205° C. while the distilled water was removed out from the system, and the reaction was allowed to proceed within the temperature range of from 205° to 210° C. The end point of the reaction was controlled by measuring Gardner viscosity, to obtain a polyetheramide-imide resin having a reduced viscosity of 0.41 dl/g. The reduced viscosity of the obtained resin was measured in dimethylformamide solvent at a concentration of 0.5 g/dl and at 30° C. (The same shall apply hereinafter). The obtained N-methylpyrrolidone solution of the polyetheramide-imide resin was diluted with N-methylpyrrolidone approximately to 25% by weight, and the obtained solution was poured into water with vigorous stirring with a mixer, to collect a solid polyetheramide-imide resin. The obtained solid resin was washed sufficiently with hot water, and was then further washed by boiling it with large amounts of water and methanol. After filtration, the solid resin was dried at 150° C. for 6 hours by employing a hot air drier, to obtain a powdery polyetheramide-imide resin which had the repeating unit represented by the following formula and was soluble in N-methylpyrrolidone.

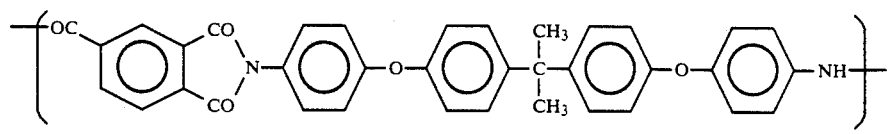

(2) Preparation of fine particles of a resin

Into a four-neck flask equipped with a thermometer, a stirrer, a nitrogen introducing tube, and a water separator charged were 218 g (1 mol) of pyromellitic dianhydride and 1,672 g of N-methylpyrrolidone (water content: 0.03%) while gaseous nitrogen was passed through the mixture. The mixture was completely dissolved by heating it to 50° C. with stirring and then keeping the temperature for 0.5 hour, to form a uniform solution. 100 g (0.5 mol) of 4,4'-diaminodiphenyl ether and 99 g (0.5 mol) of 4,4'-diaminodiphenylmethane were added to the solution, and the mixture was completely dissolved by heating it immediately to 110° C. and keeping the temperature for 20 minutes, to form a uniform solution. Subsequently, the temperature was raised to 200° C. in about 2 hours, and reaction was carried out for 3 hours with the temperature kept at 200° C. During the heating, separation of fine particles of a polyimide resin was observed at about 140° C. During the reaction, the distilled water was immediately removed out from the system.

In the thus obtained N-methylpyrrolidone dispersion, dispersion a of yellowish brown fine particles of polyimide resin was observed, and the fine particles of polyimide resin were collected by filtration. The fine particles of polyimide resin were then boiled in acetone twice, and were then dried at 200° C. for 5 hours under a reduced pressure. The fine particles of polyimide resin were porous and almost spherical in shape, and had an average particle size of 8 μm and a maximum particle size of not more than 40 μm. The average particle size was measured by employing a type TA-II counter produced by Coulter Electronics, Inc. (The same shall apply hereinafter.). The fine particles of polyimide resin were insoluble in N-methylpyrrolidone, and the polyimide resin had the repeating unit represented by the following formula.

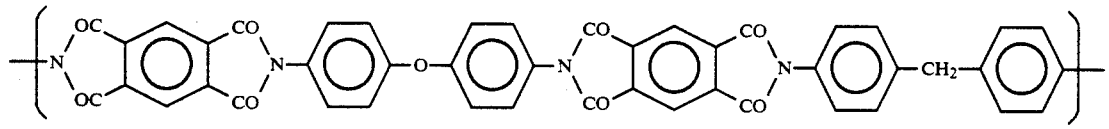

(3) Preparation of paste 15 g of the powdery soluble polyetheramide-imide prepared in (1), 25 g of the fine particles of polyimide resin prepared in (2), and 60 g of N-methylpyrrolidone were kneaded roughly in a mortar, and were then kneaded by passing them six times through a high speed three-roll mixing mill, to obtain a paste in which fine particles of resin were dispersed.

COMPARATIVE EXAMPLE 2

(1) Preparation of fine particles of a heat-resistant resin by employing a non-aqueous dispersion polymerization (a) Synthesis of a dispersion stabilizer Into a four-neck flask equipped with a thermometer, a stirrer, and an allihn condenser charged were 185.7 g of ISOPAR-H (an aliphatic hydrocarbon produced by Esso Standard Oil Co., Ltd.; Trade name), 106.8 g of lauryl methacrylate, and 6.1 g of 2-hydroxyethyl methacrylate, and were then heated to 100° C. While gaseous nitrogen was passed through the mixture, into the mixture dropped was a previously prepared mixture of 106.9 g of lauryl methacrylate, 24.5 g of 2-hydroxyethyl methacrylate, and 2.4 g of a benzoyl peroxide paste (benzoyl peroxide content: 50% by weight) over 2 hours with stirring. After kept at 100° C. for one hour, the mixture was heated to 140° C., and was then allowed to react for 4 hours at the same temperature. The thus obtained solution of dispersion stabilizer contained 55% by weight of non-volatile matter after dried for 2 hours at 170° C., and the number average molecular weight of the obtained dispersion stabilizer was 66,800 (The number average molecular weight was determined by gel permeation chromatography using the working curve of a polystyrene having a known molecular weight.).

(b) Preparation of fine particles of a polyamide-imide resin

Into a 500 ml four-neck flask equipped with a thermometer, a stirrer, and an allihn condenser charged were 35.1 g of 4,4'-diphenylmethane diisocyanate, 16.3 g of MR-100 (produced by Nippon Polyurethane Co., Ltd.; an aromatic polyisocyanate), 19 g of the dispersion stabilizer solution (content of non-volatile matter: 40% by weight) obtained in (a), 150 g of ISOPAR-H, and 9.0 g of N-methylpyrrolidone while gaseous nitrogen was passed through the mixture, and they were heated to 100° C. with stirring at 380 rpm.

Subsequently, after addition of 38.5 g of trimellitic anhydride that had been previously pulverized into a powder state, the obtained mixture was heated for one hour at 100° C., for one hour at 115° C., for one hour at 125° C., for one hour at 140° C., and for 2 hours at 170° C., to carry out reaction. The thus formed brown fine particles of polyamide-imide resin dispersing in a continuous phase of ISOPAR-H were collected by filtration, boiled in water and in methanol in the order and filtered, and dried at 60° C. for 5 hours at a reduced pressure. The fine particles of polyamide-imide resin were insoluble in N-methylpyrrolidone, spherical in shape, and non-porous.

As a result of an infrared ray absorption spectra (IR) analysis of this polyamide-imide resin, there were observed absorptions due to imide bonds at 1780 cm$^{-1}$ and amide bonds at 1650 cm$^{-1}$ and 1540$^{-1}$, respectively. The fine particles of polyamide-imide resin had an average particle size of about 3 μm and a maximum particle size of not more than 40 μm.

(2) Preparation of paste 15 g of the powdery, soluble polyether amide-imide resin prepared in Comparative Example 1. (1), 25 g of the fine particles of polyamide-imide resin prepared in this comparative example (1). (b), and 60 g of N-methylpyrrolidone were kneaded roughly in a mortar, and were then kneaded by passing them six times through a high speed three-roll mixing mill, to obtain a paste in which fine particles of a resin were dispersed.

EXAMPLE 1

(1) Preparation of a soluble, heat-resistant resin (B)

| Components | (gram) | (mol) |
| --- | --- | --- |
| Trimellitic anhydride | 192 | 1.0 |
| 4,4'-diaminodiphenylmethane | 202 | 1.02 |
| Aqueous solution of phosphoric acid (phosphoric acid content: 85% by weight) | 6.92 | |
| N-methylpyrrolidone | 400 | |

All the above components excluding trimellitic anhydride were charged into a four neck flask equipped with a thermometer, a stirrer, a nitrogen introducing tube, and a water separator, with stirring, and the mass was heated slowly to 205° C. while gaseous nitrogen was passed through the mass. After kept at 205° C. for one hour, the mass was cooled to 175° C., and trimellitic anhydride was added thereto at the same temperature over about 10 minutes. Subsequently, the mixture was heated and was allowed to react in a temperature range of from 205° to 210° C. The water distilled after the addition of trimellitic anhydride was immediately removed out from the reaction system, and the reaction was allowed to proceed while the distilled N-methylpyrrolidone was replenished. The end point of the reaction was controlled by measuring the Gardner viscosity, to obtain a polyamide-imide resin having a reduced viscosity of 0.50 dl/g. From the resulting solution of the polyamide-imide resin, a powdery polyamide-imide resin was obtained. The polyamide-imide resin was soluble in the solvent mixture of N-methylpyrrolidone (A$_1$) and diethylene glycol dimethyl ether (A$_2$) to be used in this Example and had the repeating unit represented by the following formula.

$$-\left(OC-\underset{CO}{\underset{|}{\bigcirc}}-\underset{CO}{\overset{|}{\bigcirc}}N-\bigcirc-CH_2-\bigcirc-NH\right)-$$

(2) Preparation of fine particles of heat-resistant resin (C)

Into a four-neck flask equipped with a thermometer, a stirrer, and a nitrogen introducing tube charged were 10.711 g (0.0364 mol) of 3,3',4,4'-biphenyltetracarboxylic dianhydride, 7.289 g (0.0364 mol) of 2,4'-diaminodiphenyl ether, and 72 g of N-methylpyrrolidone while gaseous nitrogen was passed through the flask. With stirring, reaction was allowed to proceed at room temperature for 10 hours. Due to the formation of polyamic acids having a high molecular weight, the viscosity of the reaction system increased to such a degree that stirring became difficult. After addition of a small amount of water for controlling the molecular weight, the reaction mixture was heated at 60° C. After addition of 52 g of acetic anhydride and 26 g of pyridine, the resulting mixture was allowed to stand for 12 hours at room temperature. The obtained paste was introduced into methanol, and the precipitated fine particles of a solid resin were collected. After sufficiently washed by boiling it in methanol, the solid resin was dried under a reduced pressure at 80° C. for 10 hours, to obtain a powdery polyimide resin (reduced viscosity: 0.68 dl/g) having the repeating unit represented by the following formula.

The polyimide resin was ground to powder with a grinder, to obtain fine particles of a polyimide resin having an average particle size of 4.5 μm and a maximum particle size of not more than 40 μm.

The fine particles of the polyimide resin were soluble in N-methylpyrrolidone ($A_1$) but insoluble in diethylene glycol dimethyl ether ($A_2$).

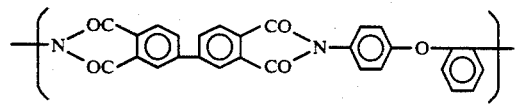

(3) Preparation of heat-resistant resin paste 15 g of the powdery, soluble polyamide-imide resin (B) prepared in the above (1) of this Example, 25 g of the fine particles of polyimide resin (C) prepared in the above (2) of this Example, 24 g of N-methylpyrrolidone ($A_1$), and 36 g of diethylene glycol dimethyl ether ($A_2$) were roughly kneaded in a mortar, and the kneaded mass was then further kneaded by passing it six times through a high speed three-roll mixing mill, to obtain a heat-resistant resin paste in which fine particles of polyimide resin were dispersed.

EXAMPLE 2

(1) Preparation of heat-resistant resin paste 15 g of the powdery, soluble heat-resistant resin (B) prepared in Example 1. (1), 25 g of fine particles of POLYIMIDE-2080 (a polyimide resin produced by The Upjohn Co.) as fine particles of heat-resistant resin (C), which had been ground so as to have an average particle size of 3.5 μm and a maximum particle size of not more than 40 μm, 24 g of N-methylpyrrolidone ($A_1$), and 36 g of diethylene glycol dimethyl ether ($A_2$) were roughly kneaded in a mortar, and the kneaded mass was further kneaded by passing it six times through a high speed three-roll mixing mill, to obtain a heat-resistant resin paste in which fine particles of POLYIMIDE-2080 having the repeating unit represented by the following formula.

EXAMPLE 3

(1) Preparation of a soluble heat-resistant resin (B)

The procedure of Example 1. (2) was repeated with the exception that 10.711 g (0.0364 mol) of 3,3',4,4'-biphenyltetracarboxylic acid dianhydride was replaced by 11.729 g (0.0364 mol) of 3,3',4,4'-benzophenonetetracarboxylic acid dianhydride, to obtain a powdery polyimide resin (reduced viscosity: 0.50 dl/g) which was soluble in the solvent mixture of N-methylpyrrolidone ($A_1$) and dioxane/diethylene glycol dimethyl ether ($A_2$) to be used in this Example 1 and had the repeating unit represented by the following formula.

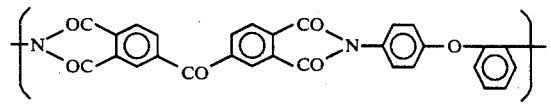

(2) Preparation of heat-resistant resin paste

Into a solution prepared by dissolving 12 g of the soluble polyimide resin (B) obtained in (1) of this Example with 24 g of N-methylpyrrolidone ($A_1$), 12 g of dioxane, and 24 g of diethylene glycol dimethyl ether ($A_2$), 28 g of the fine particles of a polyimide resin (C) prepared in Example 1.(2) were added, and the mass was roughly kneaded in a mortar, and was then further kneaded by passing it six times through a high speed three-roll mixing mill, to obtain a heat-resistant resin paste in which fine particles of polyimide resin were dispersed.

The fine particles of a polyimide resin (C) prepared in Example 1.(2) were soluble in N-methylpyrrolidone ($A_1$), but insoluble in dioxanediethylene glycol dimethyl ether ($A_2$).

EXAMPLE 4

(1) Preparation of a soluble heat-resistant resin (B)

Into a four-neck flask equipped with a thermometer, a stirrer, and a nitrogen introducing tube charged were 44.424 g (0.1 mol) of 1,1,1,3,3,3-hexafluoro-2,2-bis(3,4-dicarboxyphenyl)propane dianhydride, and 33.426 g (0.1 mol) of 1,1,1,3,3,3-hexafluoro-2,2-bis(4-amino-

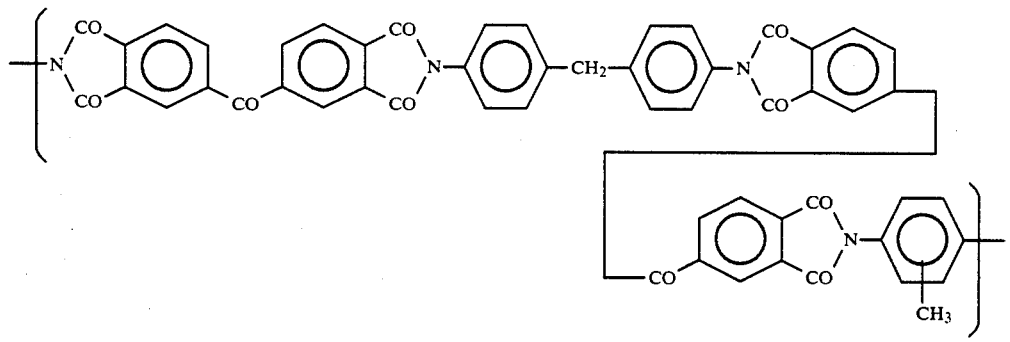

The fine particles of POLYIMIDE-2080 were soluble in N-methylpyrrolidone ($A_1$), but insoluble in diethylene glycol dimethyl ether ($A_2$).

phenyl)propane, and 441 g of N-methylpyrrolidone while gaseous nitrogen was passed through the flask. With stirring, reaction was allowed to react for 6 hours at room temperature. Due to the formation of a polyamic acid having a high molecular weight, the viscosity of the reaction system increased to such a degree that stirring became difficult to continue. After allowed to react further at 60° C. for 4 hours, the reaction mixture was cooled. After addition of 143 g of acetic anhydride and 72 g of pyridine, the reaction mixture was then allowed to stand for 12 hours at room temperature. The thus-obtained paste was introduced in water, and the precipitated fine particles of a solid resin were collected. After being washed sufficiently by boiling it in methanol, the collected solid resin was dried under a reduced pressure at 80° C. for 10 hours, to obtain a powdery polyimide resin (reduced viscosity: 0.62 dl/g) which was soluble in the solvent mixture of tetraethylene glycol dimethyl ether ($A_1$) and butyl cellosolve acetate ($A_2$) to be used in this Example and had the repeating unit represented by the following formula.

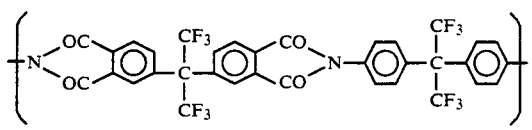

(2) Preparation of fine particles of heat-resistant resin (C)

According to the procedure of Comparative Example 2.(1).(b), the non-aqueous dispersion polymerization was repeated with the exception that 4,4'-diphenylmethane diisocyanate and MR-100 were replaced by 62.1 g of 2,2-bis[4-(4-isocyanatephenoxy)phenyl]propane, and 9.0 g of N-methylpyrrolidone was replaced by 100 g of N-methylpyrrolidone, to obtain fine particles of a polyamide-imide resin which had an average particle size of 10 μm and a maximum particle size of 40 μm or less and had the repeating unit represented by the following formula.

The fine particles of the polyamide-imide resin were soluble in tetraethylene glycol dimethyl ether ($A_1$) but insoluble in butyl cellosolve acetate ($A_2$).

(3) Preparation of heat-resistant resin paste

Into a solution prepared by dissolving 15 g of the soluble polyimide resin (B) prepared in the above (1) of this Example in a mixture of 42 g of tetraethylene glycol dimethyl ether ($A_1$) and 18 g of butyl cellosolve acetate ($A_2$), added was 25 g of the fine particles of a polyamide-imide resin obtained in the above (2) of this Example, and the resulting mass was roughly kneaded in a mortar, and was then further kneaded by passing it six times through a high speed three-roll mixing mill, to obtain a heat-resistant resin paste in which soluble fine particles of polyamide-imide resin were dispersed.

EXAMPLE 5

(1) Preparation of a soluble, heat-resistant resin (B)

Into a four-neck flask equipped with a thermometer, a stirrer, and a nitrogen introduction tube charged were 175.5 g of maleic anhydride and 500 g of acetone while gaseous nitrogen was passed through the flask, and the mixture was then heated to reflux temperature. Subsequently, a solution previously prepared by dissolving 346.5 g of 2,2-bis[4-(4-aminophenoxy)phenyl]propane in 670 g of acetone was added dropwise into the heated mixture over about one hour. After reaction for 0.5 hour at reflux temperature, bismaleinamic acid was precipitated. Subsequently, into the reaction mixture added was a liquid mixture of 250 g of acetic anhydride, 30 g of triethylamine, and 1.7 g of nickel acetate tetrahydrate at reflux temperature, and the resulting mass was allowed to react for about 3 hours at the reflux temperature and was then cooled. The obtained solution was introduced in chilled water, and the obtained precipitate was washed sufficiently with water. The precipitate was filtered and dried under a reduced pressure at 60° C. for 10 hours. 100 g of the obtained powder was dissolved in 200 g of acetone at 50° C., and the resulting solution was then allowed to stand at room temperature for 24 hours. The resulting crystals were filtered and dried under a reduced pressure at 70° C. for 5 hours, to obtain bismaleimide (B) which was soluble in the solvent mixture of N-methylpyrrolidone ($A_1$) and butyl cellosolve acetate ($A_2$) to be used in this Example.

(2) Preparation of heat-resistant resin paste 37.5 g of the soluble bismaleimide (B) obtained in the above (1) of this Example, 25 g of fine particles of POLYIMIDE-2080 (C) (The fine particles of POLYIMIDE-2080 were soluble in N-methylpyrrolidone ($A_1$) but were insoluble in butyl cellosolve acetate ($A_2$).) used in Example 2 as fine particles of a polyimide resin, 18 g of N-methylpyrrolidone ($A_1$), and 19.5 g of butyl Cellosolve acetate ($A_2$) were roughly kneaded in a mortar, and the kneaded mass was then further kneaded by passing it six times through a high speed three-roll mixing mill, to obtain a heat-resistant resin paste in which fine particles of soluble polyimide resin were dispersed.

EXAMPLE 6

(1) Preparation of a soluble heat-resistant resin (B)

Into a four-neck flask equipped with a thermometer, a stirrer, a nitrogen introducing tube, and a condenser tube charged were 153.058 g (0.475 mol) of 3,3',4,4'-benzophenonetetracarboxylic acid dianhydride, 139.930 g (0.475 mol) of 3,3',4,4'-biphenyltetracarboxylic acid dianhydride, 21.326 g (0.0500 mol) of [1,3-bis(3,4-dicarboxyphenyl)-1,1,3,3-tetramethyldisiloxane] dianhydride, 92.601 g (2.01 mol) of ethanol, and 567 g of 1,3-dimethyl-2-imidazolidinone, and the charged mass was heated to 100° C. with stirring. Then, the heated mass was allowed to react at 100° C. for 4 hours to obtain half-esters of the tetracarboxylic acid dianhydrides.

The thicknesses of the films were measured with an electromagnetic film-thickness measuring instrument.

Figure 2:
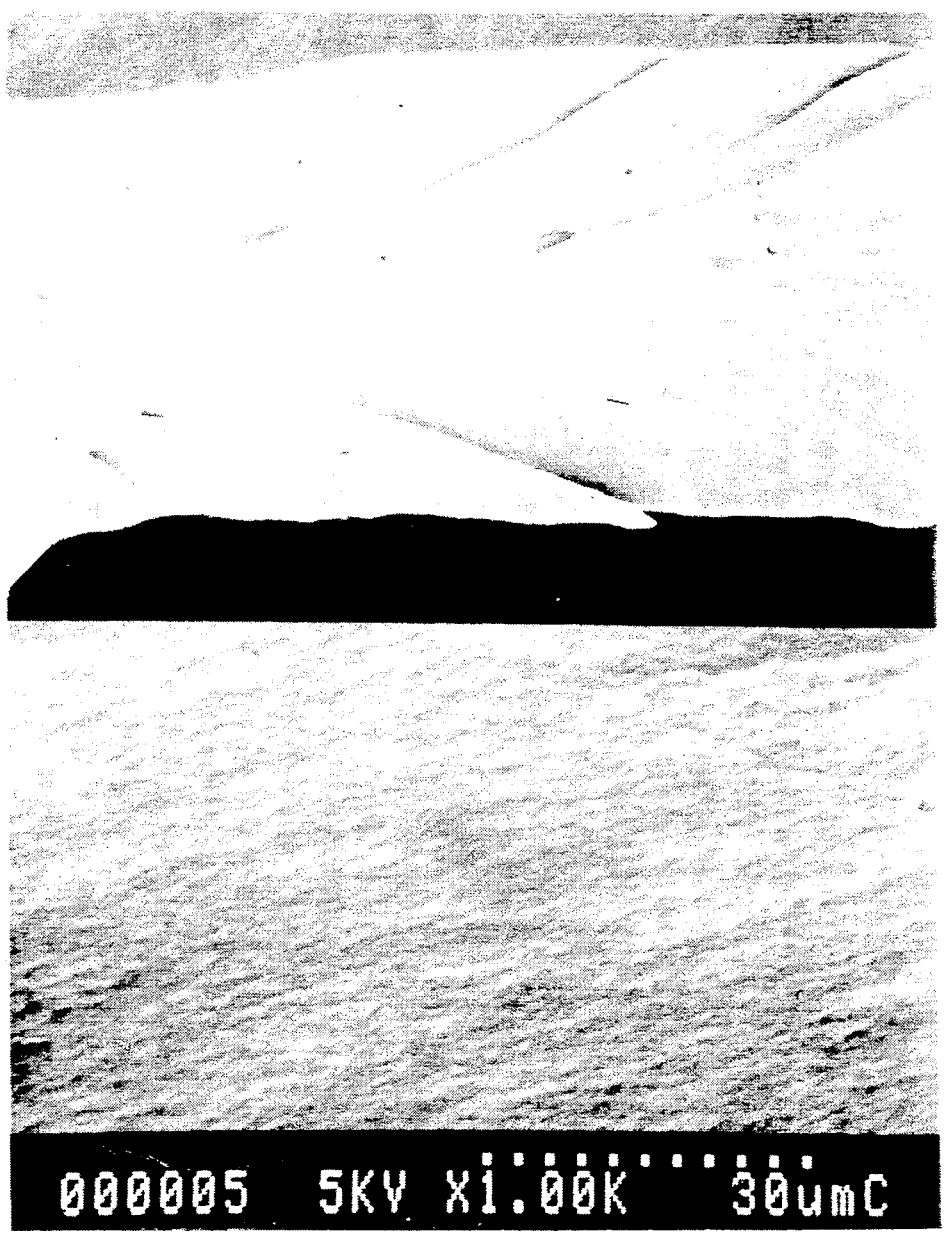
FIG. 2 is a scanning electron micrograph showing an enlarged cross section of the film formed from the heat-resistant resin paste of Example 2.

FIG. 1 and FIG. 2 each show the scanning microphotograph of the cross sections of the films formed from the pastes obtained in Comparative Example 1 and Example 2, respectively.

TABLE 1

|  | Comparative Example 1 | Comparative Example 2 | Example 1 | Example 2 | Example 3 | Example 4 | Example 5 | Example 6 |
|---|---|---|---|---|---|---|---|---|
| ($A_1$) | N-methyl-pyrrolidone | N-methyl-pyrrolidone | N-methyl-pyrrolidone | N-methyl-pyrrolidone | N-methyl-pyrrolidone | Tetraethylene glycol dimethyl ether | N-methyl-pyrrolidone | 1,3-dimethyl-2-imidazolidinone |
| ($A_2$) | — | — | Diethylene glycol dimethyl ether | Diethylene glycol dimethyl ether | Dioxane + Diethylene glycol dimethyl ether | Butyl cellosolve acetate | Butyl cellosolve acetate | Triethylene glycol dimethyl ether |
| Weight ratio of ($A_1$)/($A_2$) | 100/0 | 100/0 | 40/60 | 40/60 | 40/60 | 70/30 | 48/52 | 40/60 |
| Weight ratio of [($A_1$) + ($A_2$)]/(B)/(C) | 60/15/25 | 60/15/25 | 60/15/25 | 60/15/25 | 60/12/28 | 60/15/25 | 25/37.5/37.5 | 50/21/29 |
| Solubility of (C) in ($A_1$) | insoluble | insoluble | soluble | soluble | soluble | soluble | soluble | soluble |
| Thixotropy index ($\eta_1/\eta_{10}$) | 3.2 | 2.5 | 3.0 | 2.3 | 2.7 | 1.8 | 3.2 | 2.2 |
| Uniformity of film (visual observation) | inferior (many pinholes and vacant spaces) | inferior (many vacant spaces) | good | good | good | good | good | good |
| Film thickness (μm) | 21 | 20 | 21 | 17 | 20 | 15 | 30 | 22 |
| Bending resistance (number of repititions) | 0 | 0 | more than 10 | more than 10 | more than 10 | more than 10 | 0~1 | 5 |

After the reaction mixture was cooled to 40° C., therein added and dissolved were 200.240 g (1.000 mol) of 4,4'-diamino diphenyl ether and 850 g of triethylene glycol dimethyl ether, to obtain a heat-resistant resin solution (resin concentration: 30% by weight).

(2) Preparation of a heat-resistant resin paste

Into 50 g of the heat-resistant resin solution (resin concentration: 30% by weight) obtained in the above-described (1) added as polyimide fine particles was 20 g of the POLYIMIDE-2080 (C) used in Example 2, and the mixture was kneaded roughly in a mortar and was then kneaded by passing it six times through a three-roll mixing mill, to obtain a heat-resistant resin paste in which fine particles of an insoluble polyimide resin were dispersed.

The fine particles of POLYIMIDE-2080 were soluble in 1,3-dimethyl-2-imidazolidinone ($A_1$) but insoluble in triethylene glycol dimethyl ether ($A_2$).

Each of the pastes prepared in Comparative Examples 1 and 2 and Examples 1 to 6 was screen printed on a wafer of silicon single crystal so that the transferred film of paste had a substantially uniform thickness, and was heated for one hour at 100° C., for 0.5 hour at 200° C., and further, for 0.5 hour at 250° C. The properties of the thus-formed film were evaluated, and results are shown in Table 1.

uniformity of the film was evaluated by visually observing the presence of a pin hole or vacant space in a scanning electron micrograph of the surface and the cross section of the film magnified from 1,000 to 10,000 diameters.

Each film was peeled off from a wafer and bent repeatedly at an angle of 180°, and bending resistance was evaluated with the number of bendings which the film could endure until it was broken.

The data shown in Table 1 indicate that the heat-resistant resin pastes of Examples 1 to 4 and 6 prepared by combining specific, organic liquid ($A_1$, $A_2$), soluble heat-resistant resin (B), and fine particles of a heat-resistant resin (C) are superior to the pastes of Comparative Examples 1 and 2 containing fillers which remain as they are after formation of films, in uniformity of film and bending resistance, which gives tentative criteria of flexibility. It is also indicated that the paste of Example 5 prepared by using as a soluble heat-resistant resin (B) a thermosetting resin having a low molecular weight is able to form a thicker film.

Further, the heat-resistant resin pastes of Examples 1 to 6 exhibited sufficient thixotropy.

The scanning electron micrograph (FIG. 1) of the film obtained in Comparative Example 2 shows that the spherical filler blended in the film remained as it was and that there existed numerous vacant spaces, and on the other hand, investigation of the sectional photograph of the film obtained in Example 2 (FIG. 2) shows the absence of visible particles or vacant space, indicating the extreme uniformity of the film. In each of FIG. 1 and FIG. 2, the upper half is a scanning electron micrograph magnified 1,000 diameters, and the lower half is a scanning electron micrograph magnified 10,000 diameters of the area shown in the upper half and encircled with the white frame.

EXAMPLE 7

(1) Preparation of a soluble, heat-resistant resin (B)

11.602 g (0.0360 mol) of 3,3', 4,4'-benzophenonetetracarboxylic dianhydride purified by recrystallizing it from acetic anhydride, 0.808 g (0.0019 mol) of [1,3-bis(3,4-dicarboxyphenyl)-1,1,3,3-tetramethyldisiloxane] dianhydride recrystallized from a liquid mixture comprising toluene and diethyl ether in the weight ratio 1:1, 7.589 g (0.0379 mol) of 2,4'-diaminodiphenyl ether recrystallized from a liquid mixture comprising methanol and water in the weight ratio 8:2 (methanol:water), and 72 g of N-methylpyrrolidone purified by vacuum distillation were charged into a four-neck flask equipped with a thermometer, a stirrer, a nitrogen introducing tube, and a water separator while gaseous nitrogen was passed through the flask. After the mass in the flask was allowed to react for 10 hours at room temperature with stirring, the temperature was raised to 200° C., and the reaction was continued at the same temperature for 8 hours. The water generated during the reaction was removed out from the reaction system immediately. The resulting solution was introduced into methanol purified by distillation, and the precipitated solid resin was collected. The obtained solid resin was sufficiently washed by boiling in methanol purified by distillation, and was then dried at 80° C. under a reduced pressure for 10 hours, to obtain a powdery polyimide resin.

The polyimide resin was soluble in the solvent mixture of N-methylpyrrolidone ($A_1$) and diethylene glycol dimethyl ether ($A_2$) to be used in this Example and had the repeating units represented by the following formulas.

mixture comprising toluene and diethyl ether in the weight ratio of 1:1, 7.993 g (0.0399 mol) of 2,4'-diaminodiphenyl ether recrystallized from a liquid mixture comprising methanol and water in the weight ratio of 8:2 (methanol:water), and 80 g of N-methylpyrrolidone purified by vacuum distillation, while gaseous nitrogen was passed through the flask. After the mass in the flask was allowed to react for 10 hours at room temperature with stirring, the temperature was raised to 200° C., and the reaction was continued at the same temperature for 10 hours. The water generated during the reaction was removed out from the reaction system immediately. The obtained solution was diluted with 644 g of N-methylpyrrolidone purified by vacuum distillation, to obtain a solution having a resin concentration of about 2.5% by weight. The solution was spray dried with a Mobile Miner type spray drier produced by Ashizawa-Niro Atomizer Ltd. to obtain fine particles, and the fine particles were then classified to obtain fine particles of a polyimide resin having an average particle size of 4 μm and a maximum particle size of not more than 40 μm. The polyimide resin had a reduced viscosity of 0.64 dl/g. The fine particles of the polyimide resin were soluble in N-methylpyrrolidone ($A_1$) but were insoluble in diethylene glycol dimethyl ether ($A_2$), and the polyimide resin had the repeating units represented by the following formulas.

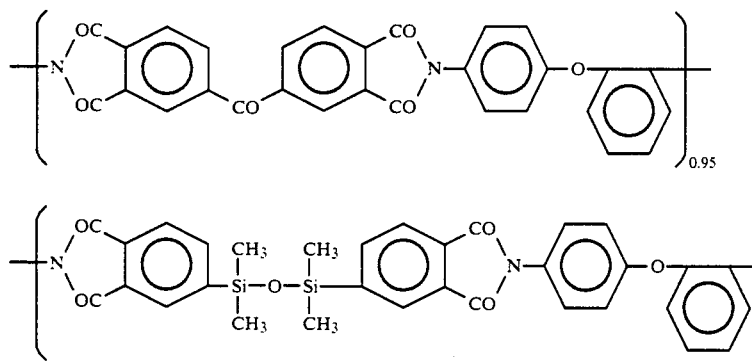

(2) Preparation of fine particles of a heat-resistant resin

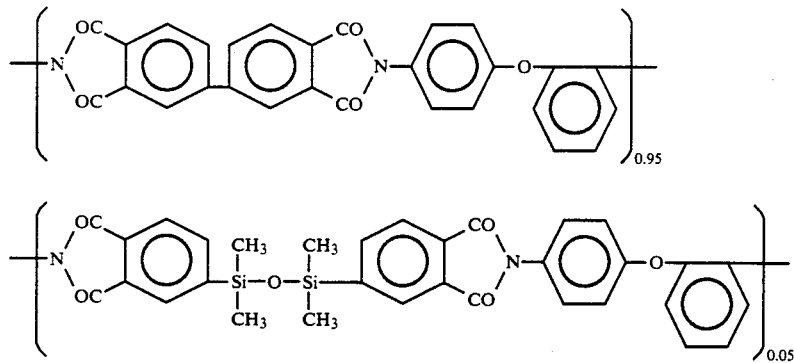

(C)

Into a four-necked flask equipped with a thermometer, a stirrer, a nitrogen introducing tube, and a water separator, charged were 11.156 g (0.0379 mol) of 3,3',4,4'-biphenyltetra-carboxylic dianhydride purified by recrystallizing it from acetic anhydride, 0.851 g (0.0020 mol) of [1,3-bis(3,4-dicarboxyphenyl)-1,1,3,3-tetramethyldisiloxane] dianhydride recrystallized from a liquid (3) Preparation of heat-resistant resin paste 6 g of the soluble polyimide resin (B) prepared in the above (1) was dissolved in a mixture of 17 g of N-methylpyrrolidone ($A_1$) purified by vacuum distillation and 25 g of diethylene glycol dimethyl ether ($A_2$) purified by vacuum distillation, and into the resulting solution added was 14 g of the fine particles of a polyimide resin (C) prepared in the above (2). The obtained mass was roughly kneaded in a mortar, and was then further kneaded by passing it six times through a high speed three-roll mixing mill, to obtain a heat-resistant resin paste in which the fine particles of polyimide resin were dispersed. After the organic liquids (solvents) were removed out from the paste, the contents of uranium and thorium were measured by radioactivation analysis to be the limit of detections or less, i.e. 0.02 ppb or less and 0.05 ppb or less, respectively. The total content of ionizable impurities, Na, K, Cu, and Fe, was 2 ppm or less.

The paste was then applied on the surface of a MOS-type RAM having an integration degree of 16K bits by screen process printing and was heat treated at 100° C., 150° C., 200° C., 250° C., and 350° C. for 0.5 hour at each of the temperatures, to obtain a polyimide protective film of about 20 $\mu$m thick. The obtained semiconductor device was sealed by molding a low-melting glass at about 450° C. so as to seal the device in a ceramic package. The soft error index of the obtained semiconductive device was 30 fits.

What is claimed is:

1. In an integrated circuit device comprising at least one insulator layer interposed between two adjacent conductor layers for insulating the conductor layers from each other, the improvement wherein the insulator layer is made of a heat-resistant resin obtainable by applying a heat-resistant resin paste consisting essentially of
   a first organic liquid ($A_1$),
   a second organic liquid ($A_2$),
   a heat-resistant resin (B) which is soluble in an organic liquid mixture consisting essentially of the first organic liquid ($A_1$) and the second organic liquid ($A_2$), and
   fine particles of a heat-resistant resin (C) which are soluble in the first organic liquid ($A_1$), but insoluble in the second organic liquid ($A_2$),
   the first organic liquid ($A_1$), the second organic liquid ($A_2$), and the heat-resistant resin (B) being brought into a solution in which the fine particles of a heat-resistant resin (C) are dispersed onto one of the conductor layers, and heating the heat-resistant resin paste applied onto the conductor layers, and in the insulator layer, the heat resistant resin (B) and the heat-resistant resin (C) forming a uniform phase.

2. An integrated circuit device wherein surface protection of a semiconductor chip is attained by a surface protecting layer fixedly covering a surface of the semiconductor chip, the surface protecting layer being made of a heat-resistant resin obtainable by applying a heat-resistant resin paste consisting essentially of
   a first organic liquid ($A_1$),
   a second organic liquid ($A_2$),
   a heat-resistant resin (B) which is soluble in an organic liquid mixture consisting essentially of the first organic liquid ($A_1$) and the second organic liquid ($A_2$), and
   fine particles of a heat-resistant resin (C) which are soluble in the first organic liquid ($A_1$), but insoluble in the second organic liquid ($A_2$),
   the first organic liquid ($A_1$), the second organic liquid ($A_2$), and the heat-resistant resin (B) being brought into a solution in which the fine particles of a heat-resistant resin (C) are dispersed onto the surface of the semiconductor chip, and heating the heat-resistant resin paste applied onto the surface of the semiconductor chip, and in the surface protecting layer, the heat-resistant resin (B) and the heat-resistant resin (C) forming a uniform phase.

3. An integrated circuit device comprising at least two conductor layers and a semiconductor chip, wherein layer insulation is attained by at least one insulator layer interposed between two adjacent conductor layers, and surface protection of the semiconductor chip is attained by a surface protecting layer fixedly covering a surface of the semiconductor chip, each of the insulator layer and the surface protecting layer being made of a heat-resistant resin obtainable by applying a heat-resistant resin paste consisting essentially of
   a first organic liquid ($A_1$),
   a second organic liquid ($A_2$),
   a heat-resistant resin (B) which is soluble in an organic liquid mixture consisting essentially of the first organic liquid ($A_1$) and the second organic liquid ($A_2$), and fine particles of a heat-resistant resin (C) which are soluble in the first organic liquid ($A_1$), but insoluble in the second organic liquid ($A_2$),
   the first organic liquid ($A_1$), the second organic liquid ($A_2$), and the heat-resistant resin (B) being brought into a solution in which the fine particles of the heat-resistant resin (C) are dispersed onto one of the conductor layers or onto the surface of the semiconductor chip, and heating the heat-resistant resin paste applied onto the conductor layer or onto the surface of the semiconductor chip, and in the insulator layer or in the surface protecting layer, the heat-resistant resin (B) and the heat-resistant resin (C) forming a uniform phase.

4. The integrated circuit device as claimed in claim 3, which contains said at least one insulating layer and also contains said surface protecting layer which provides surface protection for a semiconductor chip.

5. The integrated circuit device as claimed in claim 1, wherein in said paste, the heat-resistant resin paste has a thixotropy index of at least 1.5.

6. The integrated circuit device as claimed in claim 5, wherein in said paste, the second organic liquid ($A_2$) is easier to evaporate out from the heat-resistant resin paste than the first organic liquid ($A_1$) is.

7. The integrated circuit device as claimed in claim 6, wherein in said paste, the heat-resistant resin (B) is selected from the group consisting of polyamide resins, polyamide-imide resins, and polyimide resins, and the fine particles of a heat-resistant resin (C) are fine particles of a heat-resistant resin selected from the group consisting of polyamide resins, polyamide-imide resins, and polyimide resins.

8. The integrated circuit device as claimed in claim 7, wherein in said paste, the fine particles of a heat-resistant resin (C) are fine particles of a heat-resistant resin selected from the group consisting of polyamide resins, polyamide-imide resins, and polyimide resins, which fine particles are prepared by employing a non-aqueous dispersion polymerization technique for preparation of the heat-resistant resin and have an average particle size of 40 $\mu$m or less.

9. The integrated circuit device as claimed in claim 2, wherein in said paste, the heat-resistant resin paste has a thixotropy index of at least 1.5.

10. The integrated circuit device as claimed in claim 9, wherein in said paste, the second organic liquid ($A_2$)

is easier to evaporate out from the heat-resistant resin paste than the first organic liquid ($A_1$) is.

11. The integrated circuit device as claimed in claim 10, wherein in said paste, the heat-resistant resin (B) is selected from the group consisting of polyamide resins, polyamide-imide resins, and polyimide resins, and the fine particles of a heat-resistant resin (C) are fine particles of a heat-resistant resin selected from the group consisting of polyamide resins, polyamide-imide resins, and polyimide resins.

12. The integrated circuit device as claimed in claim 11, wherein in said paste, the fine particles of a heat-resistant resin (C) are fine particles of a heat-resistant resin selected from the group consisting of polyamide resins, polyamide-imide resins, and polyimide resins, which fine particles are prepared by employing a non-aqueous dispersion polymerization technique for preparation of the heat-resistant resin and have an average particle size of 40 μm or less.

13. The integrated circuit device as claimed in claim 4, wherein in said paste, the heat-resistant resin paste has a thixotropy index of at least 1.5.

14. The integrated circuit device as claimed in claim 13, wherein in said paste, the second organic liquid ($A_2$) is easier to evaporate out from the heat-resistant resin paste than the first organic liquid ($A_1$) is.

15. The integrated circuit device as claimed in claim 14, wherein in said paste, the heat-resistant resin (B) is selected from the group consisting of polyamide resins, polyamide-imide resins, and polyimide resins, and the fine particles of a heat-resistant resin (C) are fine particles of a heat-resistant resin selected from the group consisting of polyamide resins, polyamide-imide resins, and polyimide resins.

16. The integrated circuit device as claimed in claim 15, wherein in said paste, the fine particles of a heat-resistant resin (C) are fine particles of a heat-resistant resin selected from the group consisting of polyamide resins, polyamide-imide resins, and polyimide resins, which fine particles are prepared by employing a non-aqueous dispersion polymerization technique for preparation of the heat-resistant resin and have an average particle size of 40 μm or less.

17. The integrated circuit device as claimed in claim 1, wherein the first organic liquid ($A_1$) and the second organic liquid ($A_2$), which are different from each other are selected from the group consisting of N-methylpyrrolidone, dimethylacetamide, dimethylformamide, 1,3-dimethyl-3,4,5,6-tetrahydro-2(1H)pyrimidinone, 1,3-dimethyl-2-imidazolidinone, sulfolane, dimethyl sulfoxide, γ-butyrolactone, γ-caprolactone, α-butyrolactone, ε-caprolactone, dioxane, 1,2-dimethoxyethane, diethylene glycol dimethyl ether, diethylene glycol diethyl ether, diethylene glycol dipropyl ether, diethylene glycol dibutyl ether, triethylene glycol dimethyl ether, triethylene glycol diethyl ether, triethylene glycol dipropyl ether, triethylene glycol dibutyl ether, tetraethylene glycol dimethyl ether, tetraethylene glycol diethyl ether, tetraethylene glycol dipropyl ether, tetraethylene glycol dibutyl ether, methyl ethyl ketone, methyl isobutyl ketone, cyclohexanone, acetophenone, butanol, octyl alcohol, ethylene glycol, glycerin, diethylene glycol monomethyl ether, diethylene glycol monoethyl ether, triethylene glycol monomethyl ether, triethylene glycol monoethyl ether, tetraethylene glycol monomethyl ether, tetraethylene glycol monoethyl ether, phenol, cresol, xylenol, ethyl acetate, butyl acetate, ethyl cellosolve acetate, butyl cellosolve acetate, toluene, xylene, diethylbenzene, cyclohexane, trichloroethane, tetrachloroethane and monochlorobenzene.

18. The integrated circuit device as claimed in claim 17, wherein the heat-resistant resin (B) has a viscosity of at least 0.3 as measured in dimethylformamide solvent at a concentration of 0.5 g/dl and at a temperature of 30° C.

19. The integrated circuit device as claimed in claim 18, wherein the fine particles of the heat-resistant resin (C) have a particle size of 0.1 to 5 μm.

20. The integrated circuit device as claimed in claim 19, wherein the first organic liquid ($A_1$) is selected from the group consisting of N-methylpyrrolidone, dimethylacetamide, 1,3-dimethyl-2-imidazolidinone, dimethylsulfoxide, γ-butyrolactone, and xylenol, and the second organic liquid ($A_2$) is selected from the group consisting of dioxane, diethylene glycol dimethyl ether, triethylene glycol dimethyl ether, cyclohexanone, butyl cellosolve acetate, butanol and xylene.

21. The integrated circuit device as claimed in claim 19, wherein the first organic liquid ($A_1$) is selected from the group consisting of tetraethylene glycol dimethyl ether and cyclohexanone, and the second organic liquid ($A_2$) is selected from the group consisting of butyl cellosolve acetate, ethyl acetate, butanol, methyl carbitol and xylene.

22. The integrated circuit device as claimed in claim 19, wherein said ($A_1$) and said ($A_2$), are in a ratio of 30 ($A_1$): 70 ($A_2$) to 70 ($A_1$): 30 ($A_2$) in parts by weight, on the basis of the sum of said ($A_1$) and said ($A_2$) being 100 parts by weight.

23. The integrated circuit device as claimed in claim 22, wherein the heat-resistant resin (B) is in an amount of 5 to 70 parts by weight per 95 to 30 parts by weight of the fine particles of the heat-resistant resin (C), on the basis of the total of said (B) and said (C) being 100 parts by weight and the concentration of the sum of (C) and (B) being 10 to 90 weight %.

24. The integrated circuit device as claimed in claim 22, wherein said (B) and said (C) are in a concentration such that the paste has a viscosity of 30 to 10,000 poise.

25. The integrated circuit device as claimed in claim 20, wherein said heat-resistant resin (B) comprises a repeating unit selected from the group consisting of

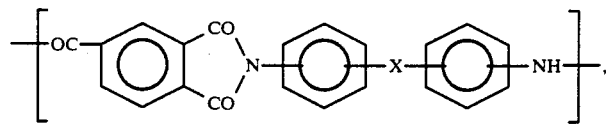

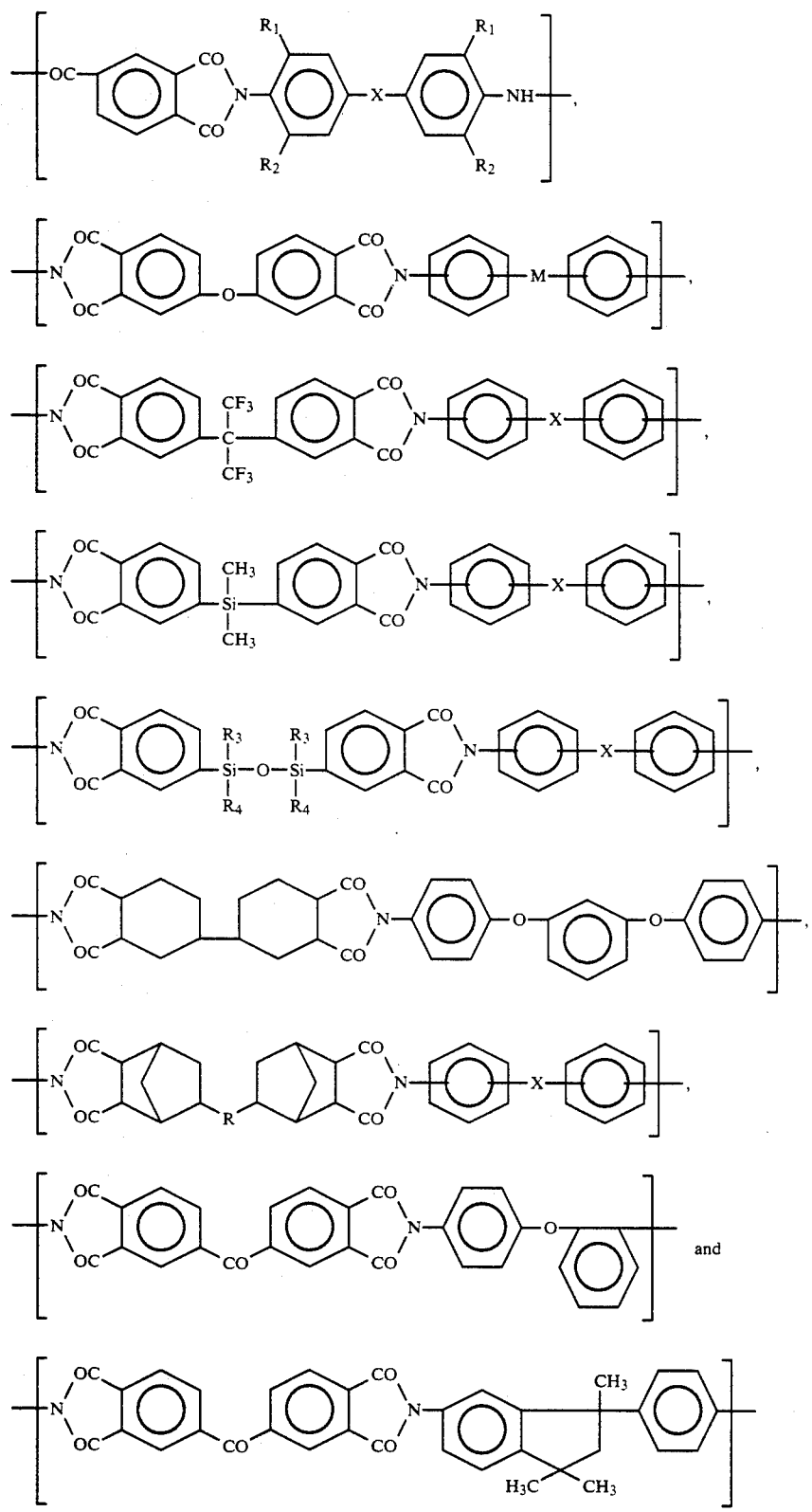
wherein
X is —CH$_2$—, —O—, —CO—, —SO$_2$—,

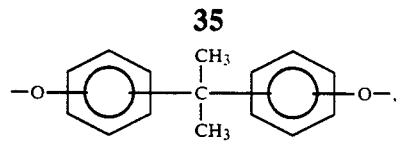

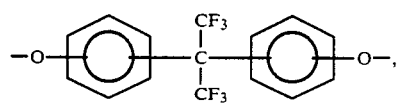

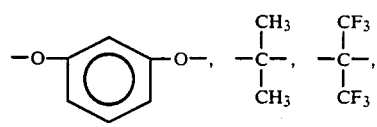

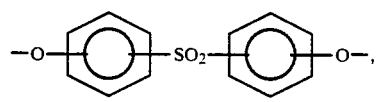

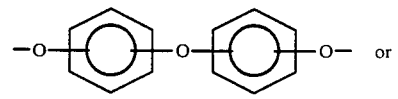

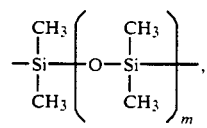

m being an integer having a value of from 1 to 100, each $R_1$ and each $R_2$ are independently hydrogen or a hydrocarbon group of 1 to 6 carbon atoms,

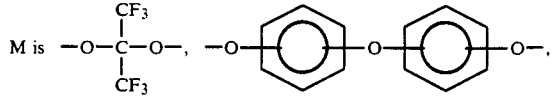

M is m being an integer having a value of from 1 to 100, each $R_3$ and each $R_4$ are independently methyl, ethyl, propyl or phenyl, and R is —S— or —SO$_2$—, and said fine particles of said heat-resistant resin (C) comprise a repeating unit selected from the group consisting of

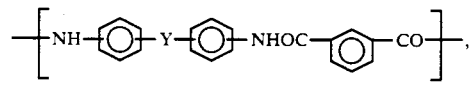

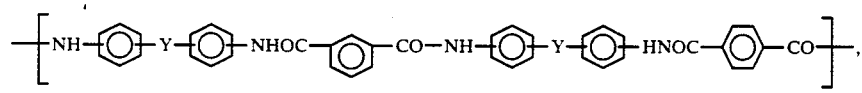

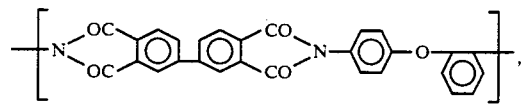

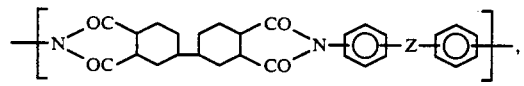

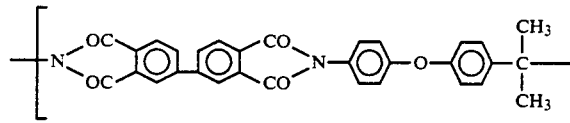

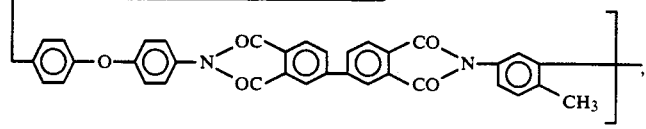

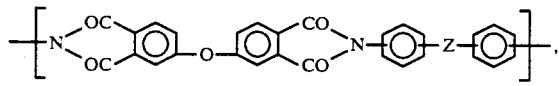

-continued

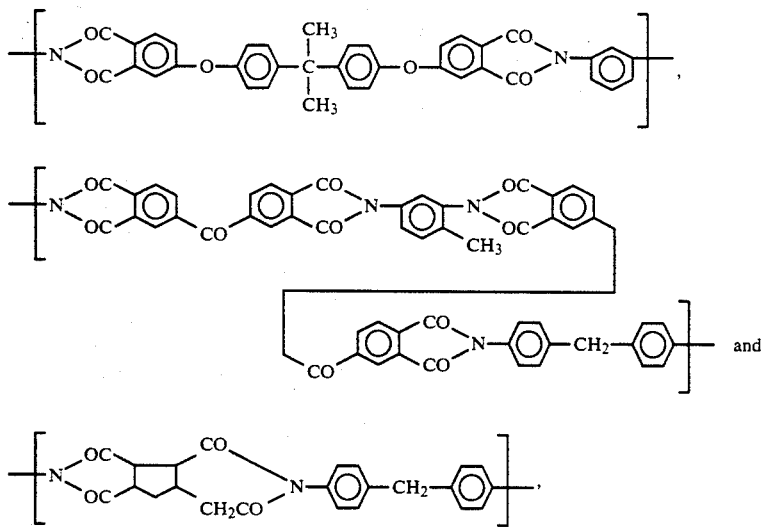

where in

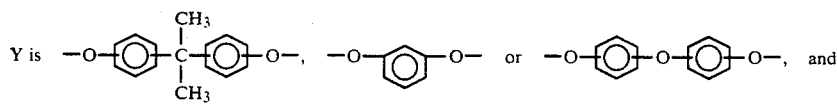

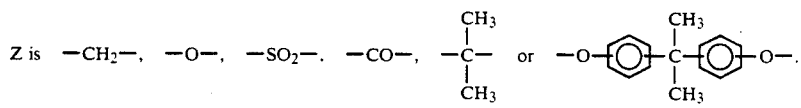

26. The integrated circuit device as claimed in claim 1, wherein the heat resistant resin (B) comprises compositions or polyamic acid ester oligomers which respectively are products of mixing or reaction of diamines with tetracarboxylic acid esters obtained from the reaction of tetracarboxylic acid dianhydrides with alcohols, derivatives of alcohols or mixtures thereof.

27. The integrated circuit device as claimed in claim 2, wherein the first organic liquid ($A_1$) and the second organic liquid ($A_2$), which are different from each other are selected from the group consisting of N-methylpyrrolidone, dimethylacetamide, dimethylformamide, 1,3-dimethyl-3,4,5,6-tetrahydro-2(1H)pyrimidinone, 1,3-dimethyl-2-imidazolidinone, sulfolane, dimethyl sulfoxide, $\gamma$-butyrolactone, $\gamma$-caprolactone, $\alpha$-butyrolactone, $\epsilon$-caprolactone, dioxane, 1,2-dimethoxyethane, diethylene glycol dimethyl ether, diethylene glycol diethyl ether, diethylene glycol dipropyl ether, diethylene glycol dibutyl ether, triethylene glycol dimethyl ether, triethylene glycol diethyl ether, triethylene glycol dipropyl ether, triethylene glycol dibutyl ether, tetraethylene glycol dimethyl ether, tetraethylene glycol diethyl ether, tetraethylene glycol dipropyl ether, tetraethylene glycol dibutyl ether, methyl ethyl ketone, methyl isobutyl ketone, cyclohexanone, acetophenone, butanol, octyl alcohol, ethylene glycol, glycerin, diethylene glycol monomethyl ether, diethylene glycol monoethyl ether, triethylene glycol monomethyl ether, triethylene glycol monoethyl ether, tetraethylene glycol monomethyl ether, tetraethylene glycol monoethyl ether, phenol, cresol, xylenol, ethyl acetate, butyl acetate, ethyl cellosolve acetate, butyl cellosolve acetate, toluene, xylene, diethylbenzene, cyclohexane, trichloroethane, tetrachloroethane and monochlorobenzene.

28. The integrated circuit device as claimed in claim 27, wherein the heat-resistant resin (B) has a viscosity of at least 0.3 as measured in dimethylformamide solvent at a concentration of 0.5 g/dl and at a temperature of 30° C.

29. The integrated circuit device as claimed in claim 28, wherein the fine particles of the heat-resistant resin (C) have a particle size of 0.1 to 5 $\mu$m.

30. The integrated circuit device as claimed in claim 29, wherein the first organic liquid ($A_1$) is selected from the group consisting of N-methylpyrrolidone, dimethylacetamide, 1,3-dimethyl-2-imidazolidinone, dimethylsulfoxide, $\gamma$-butyrolactone, and xylenol, and the second organic liquid ($A_2$) is selected from the group consisting of dioxane, diethylene glycol dimethyl ether, triethylene glycol dimethyl ether, cyclohexanone, butyl cellosolve acetate, butanol and xylene.

31. The integrated circuit device as claimed in claim 29, wherein the first organic liquid ($A_1$) is selected from the group consisting of tetraethylene glycol dimethyl ether and cyclohexanone, and the second organic liquid ($A_2$) is selected from the group consisting of butyl cellosolue acetate, ethyl acetate, butanol, methyl carbitol and xylene.

32. The integrated circuit device as claimed in claim 29, wherein said ($A_1$) and said ($A_2$), are in a ratio of 30 ($A_1$):70 ($A_2$) to 70 ($A_1$):30 ($A_2$) in parts by weight, on the basis of the sum of said ($A_1$) and said ($A_2$) being 100 parts by weight.

33. The integrated circuit device as claimed in claim 32, wherein the heat-resistant resin (B) is in an amount of 5 to 70 parts by weight per 95 to 30 parts by weight of the fine particles of the heat-resistant resin (C), on the basis of the total of said (B) and said (C) being 100 parts by weight and the concentration of the sum of (C) and (B) being 10 to 90 weight %.

34. The integrated circuit device as claimed in claim 32, wherein said (B) and said (C) are in a concentration such that the paste has a viscosity of 30 to 10,000 poise.

35. The integrated circuit device as claimed in claim 30, wherein said heat-resistant resin (B) comprises a repeating unit selected from the group consisting of

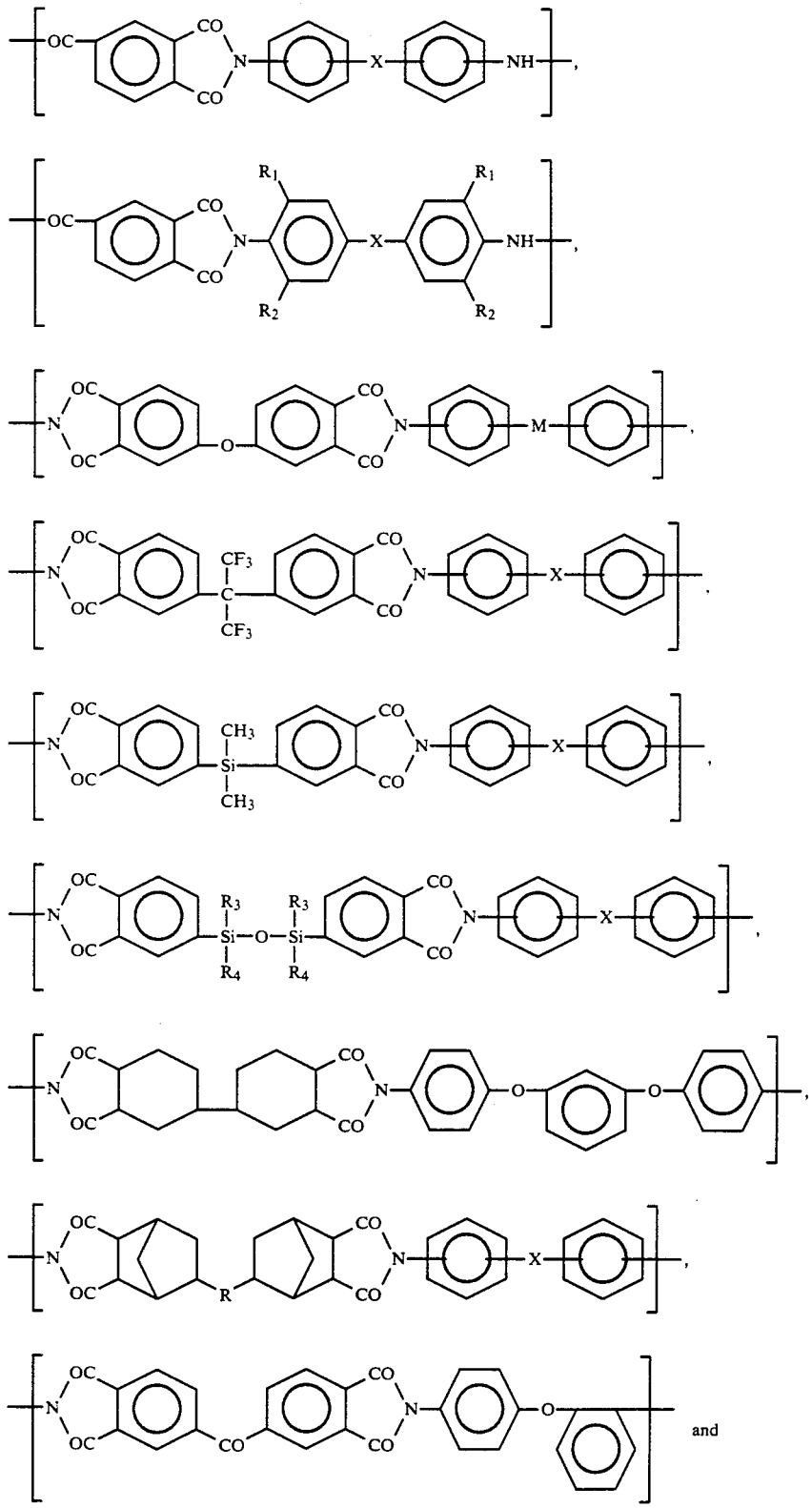

and

-continued

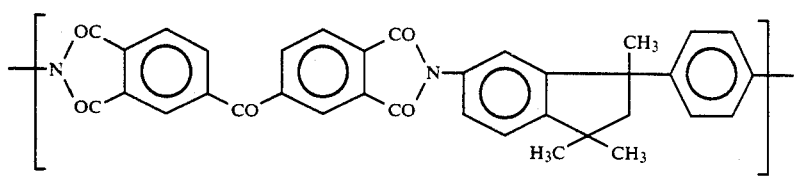

wherein
X is —CH$_2$—, —O—, —CO—, —SO$_2$—,

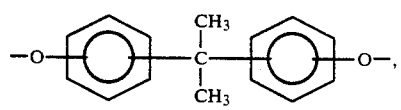

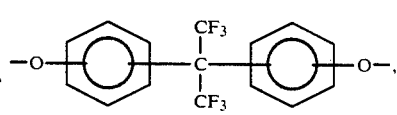

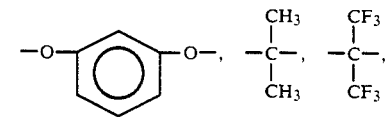

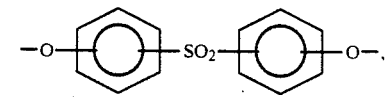

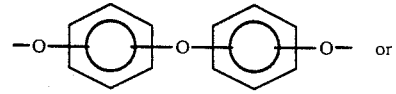 or

-continued

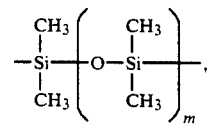

m being an integer having a value of from 1 to 100,
each R$_1$ and each R$_2$ are independently hydrogen or a hydrocarbon group of 1 to 6 carbon atoms, M is 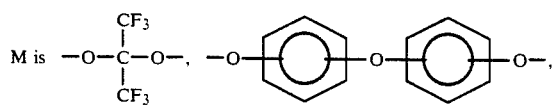

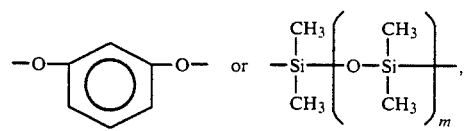

m being an integer having a value of from 1 to 100,
each R$_3$ and each R$_4$ are independently methyl, ethyl, propyl or phenyl, and
R is —S— or —SO$_2$—,
and said fine particles of said heat-resistant resin (C) comprise a repeating unit selected from the group consisting of

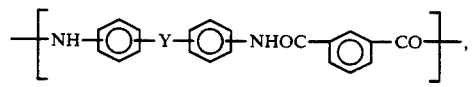

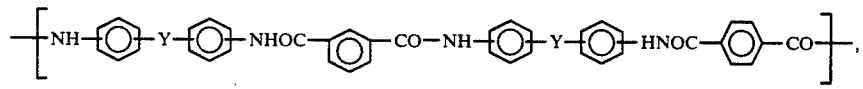

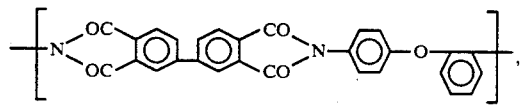

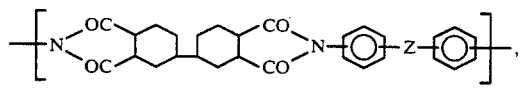

-continued

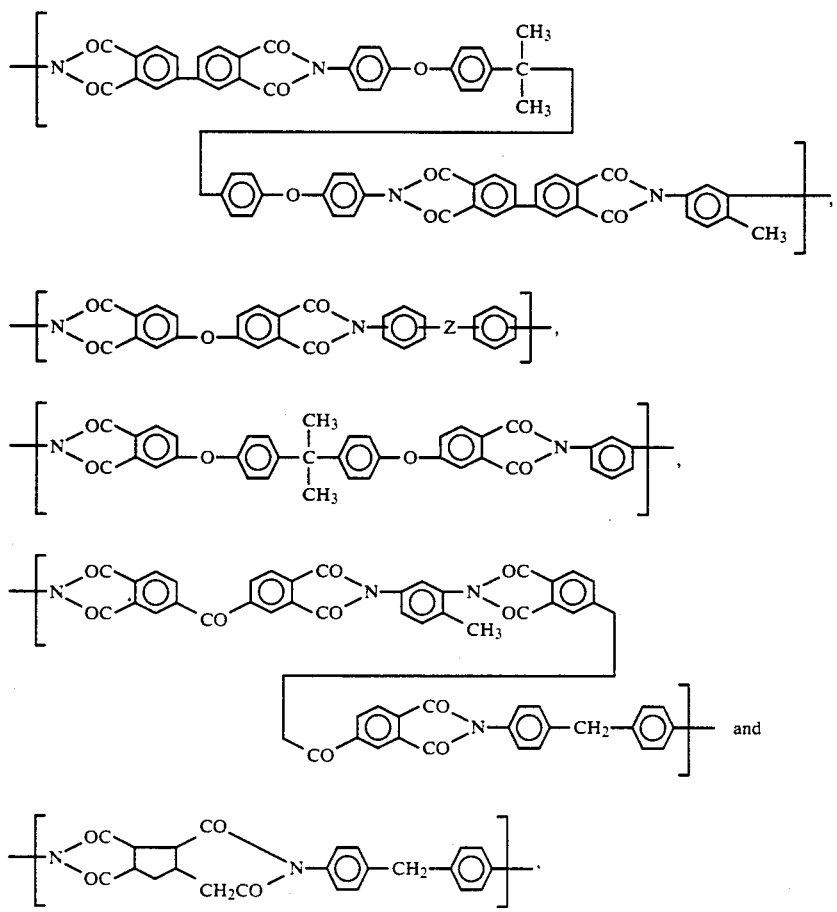

where in

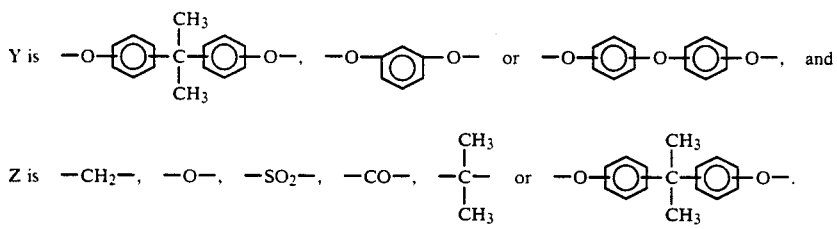

36. The integrated circuit device as claimed in claim 2, wherein the heat resistant resin (B) comprises compositions or polyamic acid ester oligomers which respectively are products of mixing or reaction of diamines with tetracarboxylic acid esters obtained from the reaction of tetracarboxylic acid dianhydrides with alcohols, derivatives of alcohols or mixtures thereof.

37. The integrated circuit device as claimed in claim 4, wherein the first organic liquid ($A_1$) and the second organic liquid ($A_2$), which are different from each other are selected from the group consisting of N-methylpyrrolidone, dimethylacetamide, dimethylformamide, 1,3-dimethyl-3,4,5,6-tetrahydro-2(1H)pyrimidinone, 1,3-dimethyl-2-imidazolidinone, sulfolane, dimethyl sulfoxide, γ-butyrolactone, γ-caprolactone, α-butyrolactone, ε-caprolactone, dioxane, 1,2-dimethoxyethane, diethylene glycol dimethyl ether, diethylene glycol diethyl ether, diethylene glycol dipropyl ether, diethylene glycol dibutyl ether, triethylene glycol dimethyl ether, triethylene glycol diethyl ether, triethylene glycol dipropyl ether, triethylene glycol dibutyl ether, tetraethylene glycol dimethyl ether, tetraethylene glycol diethyl ether, tetraethylene glycol dipropyl ether, tetraethylene glycol dibutyl ether, methyl ethyl ketone, methyl isobutyl ketone, cyclohexanone, acetophenone, butanol, octyl alcohol, ethylene glycol, glycerin, diethylene glycol monomethyl ether, diethylene glycol monoethyl ether, triethylene glycol monomethyl ether, triethylene glycol monoethyl ether, tetraethylene glycol monomethyl ether, tetraethylene glycol monoethyl ether, phenol, cresol, xylenol, ethyl acetate, butyl acetate, ethyl cellosolve acetate, butyl cellosolve acetate, toluene, xylene, diethylbenzene, cyclohexane, trichloroethane, tetrachloroethane and monochlorobenzene.

38. The integrated circuit device as claimed in claim 37, wherein the heat-resistant resin (B) has a viscosity of at least 0.3 as measured in dimethylformamide solvent at a concentration of 0.5 g/dl and at a temperature of 30° C.

39. The integrated circuit device as claimed in claim 38, wherein the fine particles of the heat-resistant resin (C) have a particle size of 0.1 to 5 μm.

40. The integrated circuit device as claimed in claim 39, wherein the first organic liquid ($A_1$) is selected from the group consisting of N-methylpyrrolidone, dimethylacetamide, 1,3-dimethyl-2-imidazolidinone, dimethylsulfoxide, γ-butyrolactone, and xylenol, and the second organic liquid ($A_2$) is selected from the group consisting of dioxane, diethylene glycol dimethyl ether, triethylene glycol dimethyl ether, cyclohexanone, butyl cellosolve acetate, butanol and xylene.

41. The integrated circuit device as claimed in claim 39, wherein the first organic liquid ($A_1$) is selected from the group consisting of tetraethylene glycol dimethyl ether and cyclohexanone, and the second organic liquid ($A_2$) is selected from the group consisting of butyl cellosolve acetate, ethyl acetate, butanol, methyl carbitol and xylene.

42. The integrated circuit device as claimed in claim 39, wherein said ($A_1$) and said ($A_2$), are in a ratio of 30 ($A_1$): 70 ($A_2$) to 70 ($A_1$): 30 ($A_2$) in parts by weight, on the basis of the sum of said ($A_1$) and said ($A_2$) being 100 parts by weight.

43. The integrated circuit device as claimed in claim 42, wherein the heat-resistant resin (B) is in an amount of 5 to 70 parts by weight per 95 to 30 parts by weight of the fine particles of the heat-resistant resin (C), on the basis of the total of said (B) and said (C) being 100 parts by weight and the concentration of the sum of (C) and (B) being 10 to 90 weight %.

44. The integrated circuit device as claimed in claim 42, wherein said (B) and said (C) are in a concentration such that the paste has a viscosity of 30 to 10,000 poise.

45. The integrated circuit device as claimed in claim 40, wherein said heat-resistant resin (B) comprises a repeating unit selected from the group consisting of

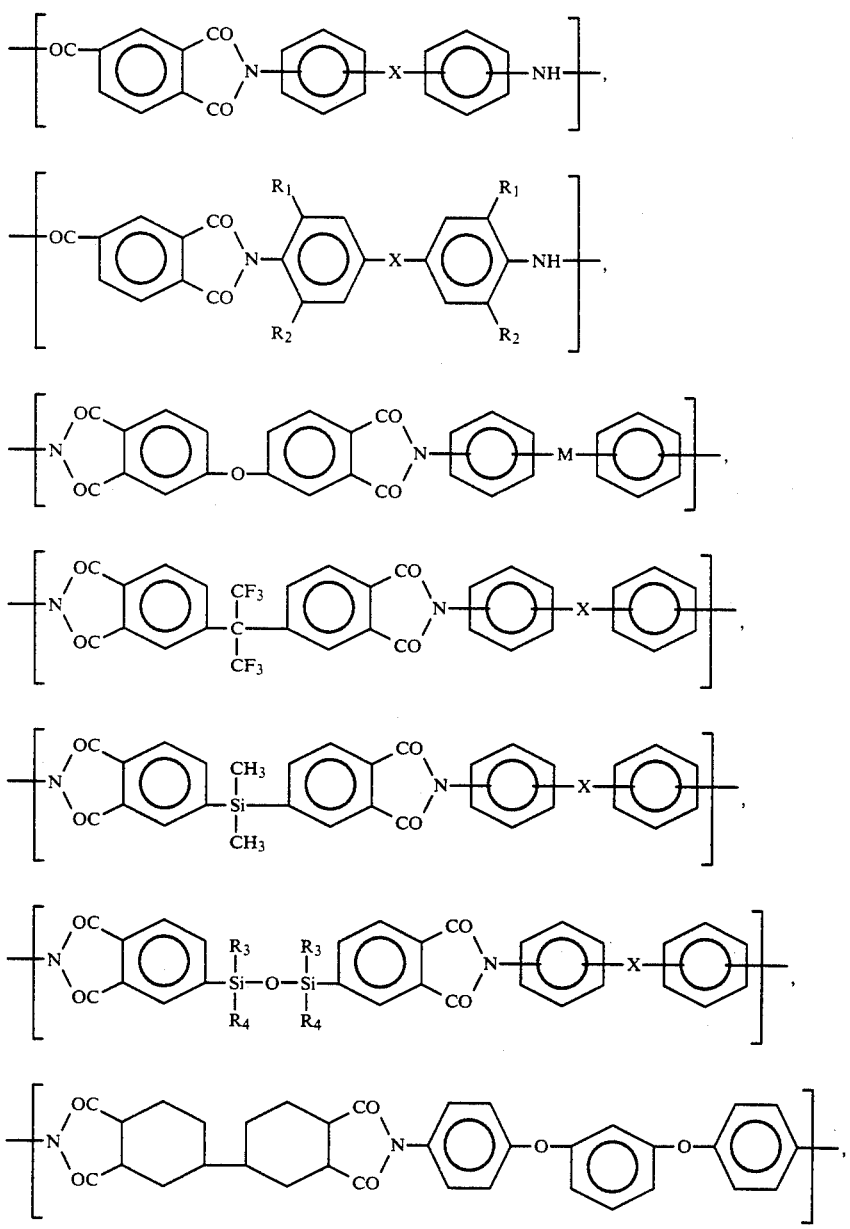

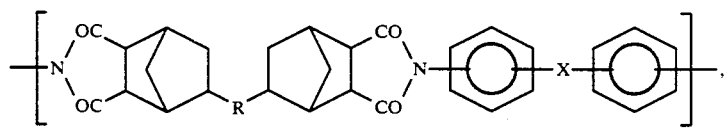

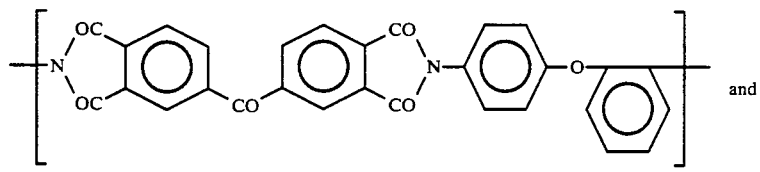 and

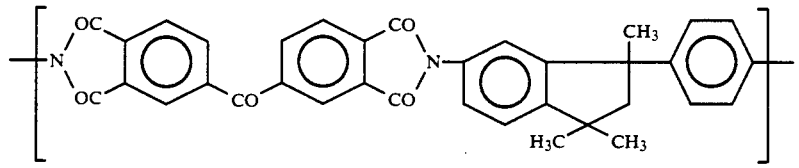

wherein
X is —CH$_2$—, —O—, —CO—, —SO$_2$—,

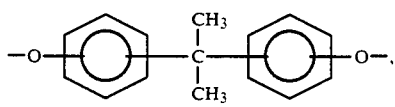

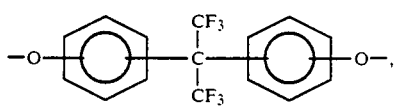

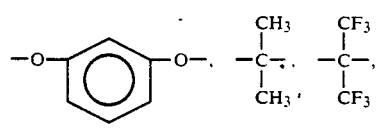,

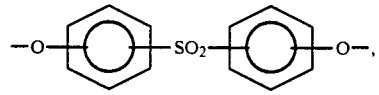

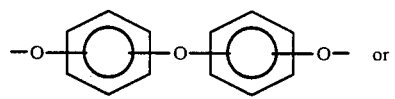 or

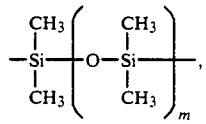, m being an integer having a value of from 1 to 100, each R$_1$ and each R$_2$ are independently hydrogen or a hydrocarbon group of 1 to 6 carbon atoms,

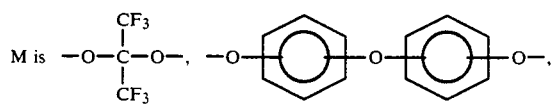

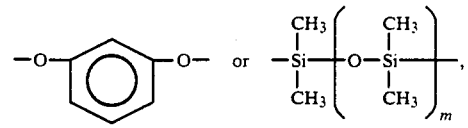, m being an integer having a value of from 1 to 100, each R$_3$ and each R$_4$ are independently methyl, ethyl, propyl or phenyl, and R is —S— or —SO$_2$—, and said fine particles of said heat-resistant resin (C) comprise a repeating unit selected from the group consisting of

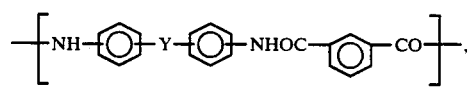,

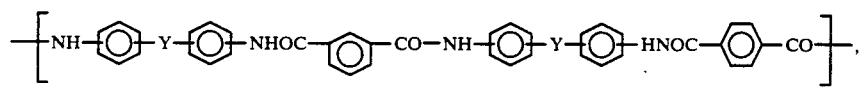,

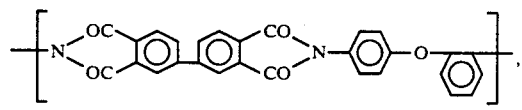,

-continued

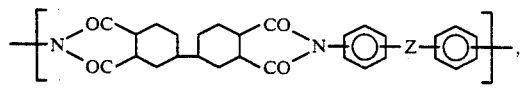

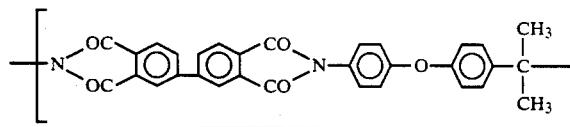

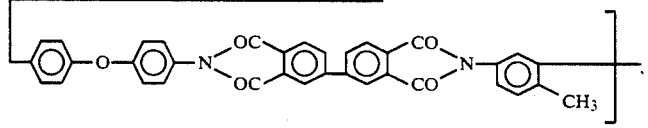

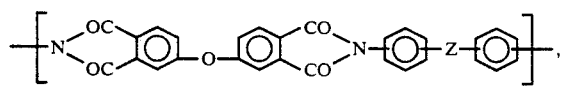

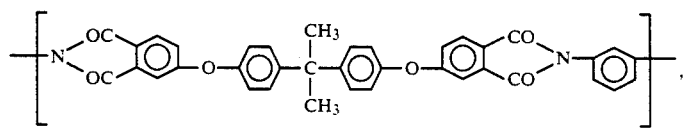

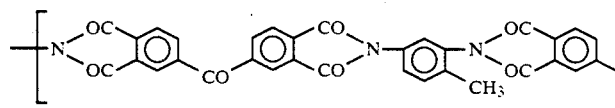

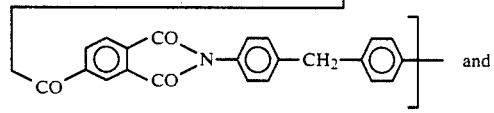

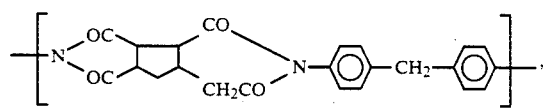

wherein

Y is 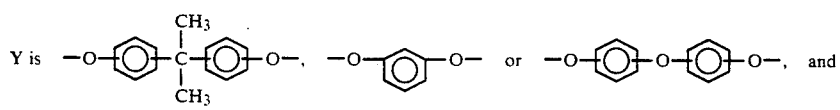

Z is 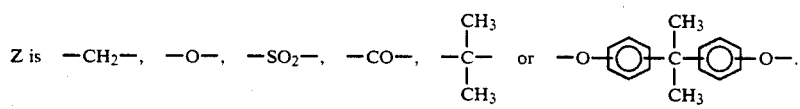

46. The integrated circuit device as claimed in claim 4, wherein the heat resistant resin (B) comprises compositions or polyamic acid ester oligomers which respectively are products of mixing or reaction of diamines with tetracarboxylic acid esters obtained from the reaction of tetracarboxylic acid dianhydrides with alcohols, derivatives of alcohols or mixtures thereof.

47. The integrated circuit device as claimed in claim 21, wherein said heat-resistant resin (B) comprises a repeating unit selected from the group consisting of

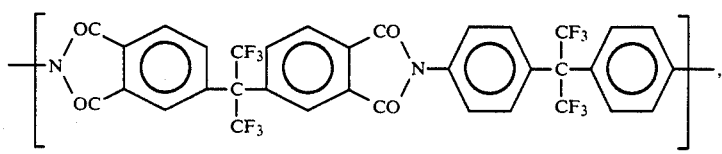

-continued
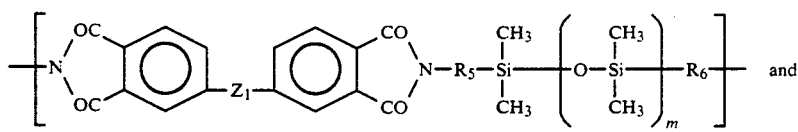 and
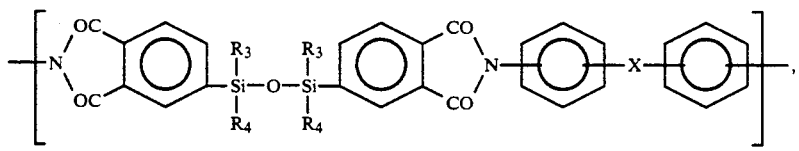
wherein
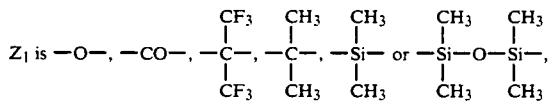
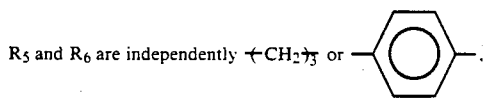
m is an integer having a value of from 1 to 100,
X is —$CH_2$—, —O—, —CO—, —$SO_2$—,
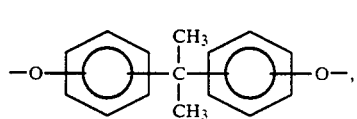
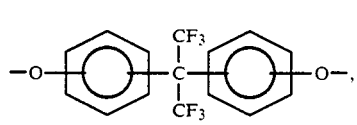
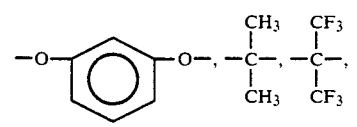
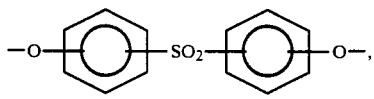
-continued
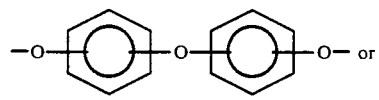
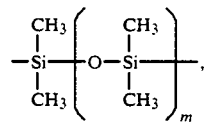
m being an integer having a value of from 1 to 100, and each $R_3$ and each $R_4$ are independently methyl, ethyl, propyl or phenyl,
and said fine particles of said heat-resistant resin (C) comprise a polyetheramide-imide having a repeating unit selected from the group consisting of
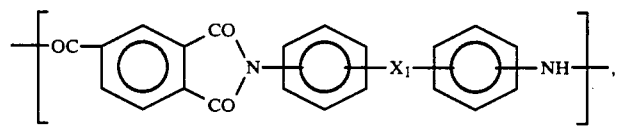
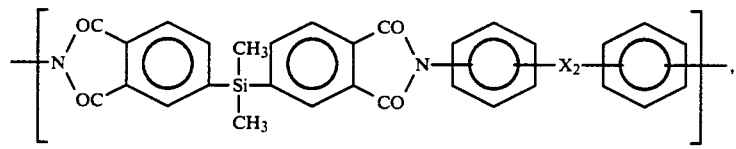
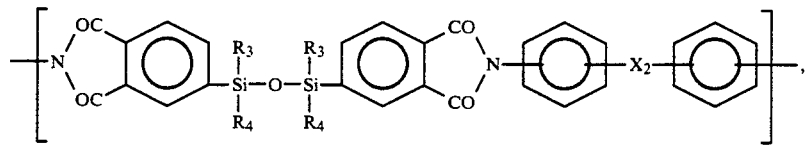

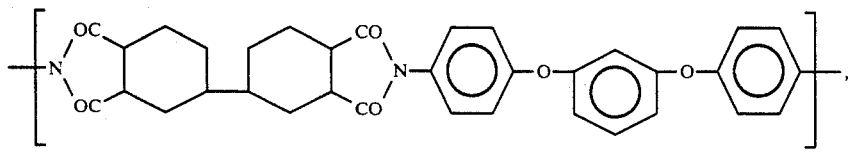
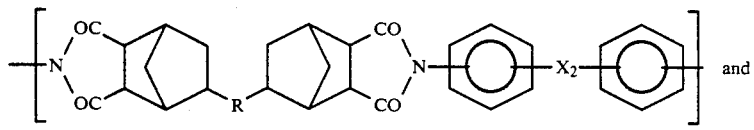
and
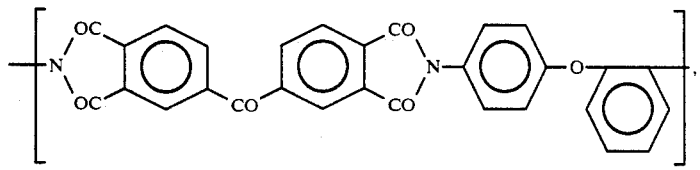
wherein $X_1$ is
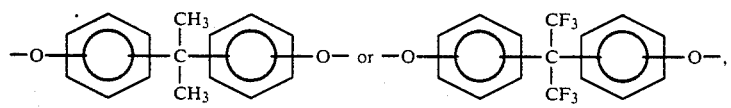
$X_2$ is $-CH_2-$, $-O-$, $-CO-$, $-SO_2-$, 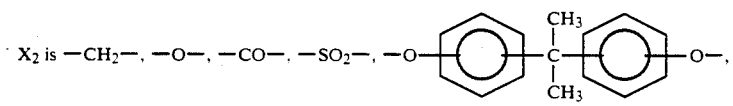
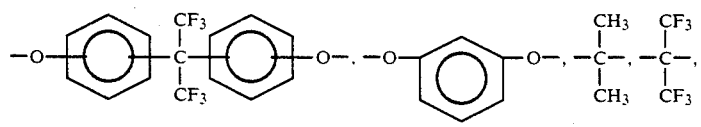
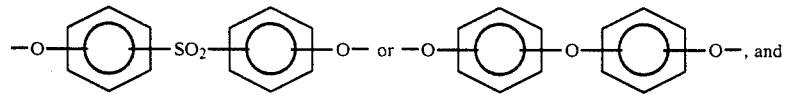, and
each $R_3$ and each $R_4$ are independently methyl, ethyl, propyl or phenyl, and
R is $-S-$ or $-SO_2-$.
48. The integrated circuit device as claimed in claim 31, wherein said heat-resistant resin (B) comprises a repeating unit selected from the group consisting of
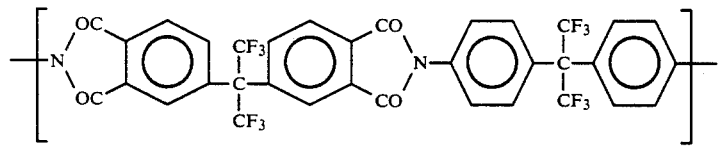
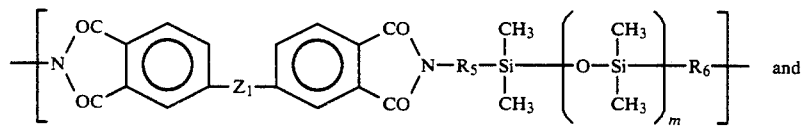 and
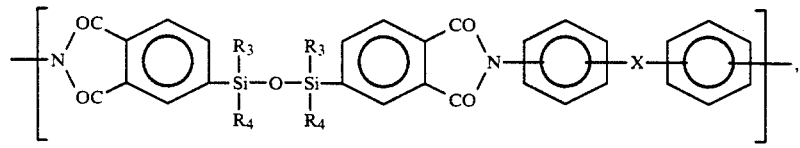

wherein
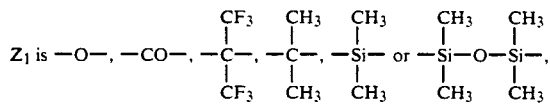
m is an integer having a value of from 1 to 100,
X is —CH$_2$—, —O—, —CO—, —SO$_2$—,
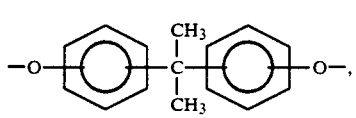
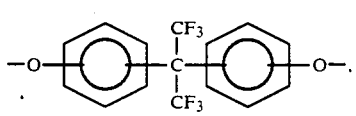
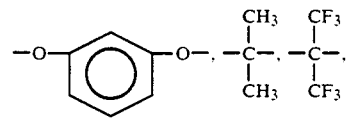
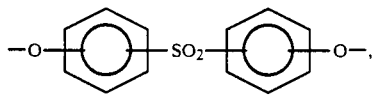
-continued
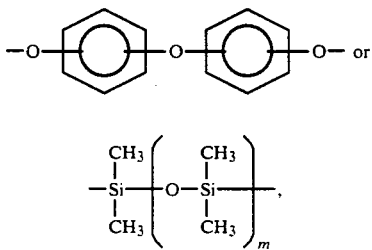
m being an integer having a value of from 1 to 100,
and each R$_3$ and each R$_4$ are independently methyl, ethyl, propyl or phenyl,
and said fine particles of said heat-resistant resin (C) comprise a polyetheramide-imide having a repeating unit selected from the group consisting of
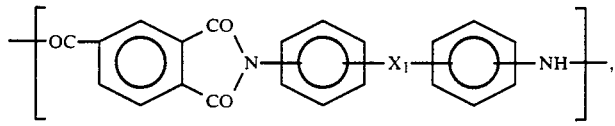
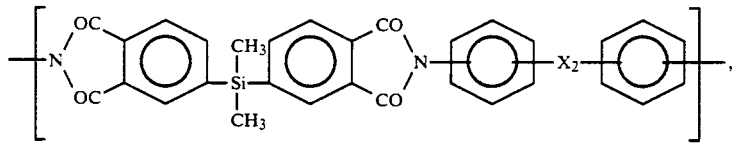
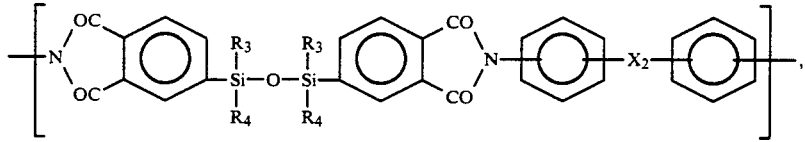
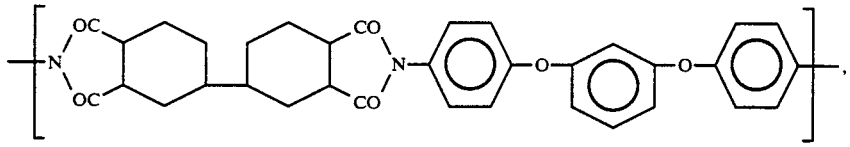
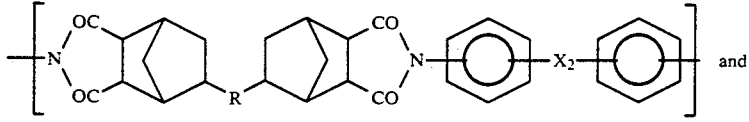
and

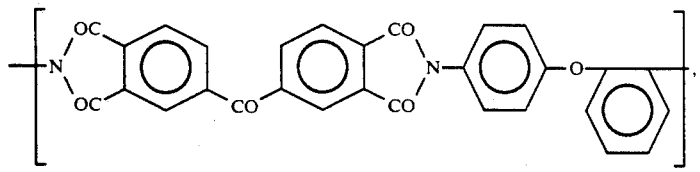
wherein $X_1$ is
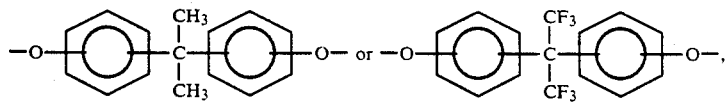
$X_2$ is $-CH_2-$, $-O-$, $-CO-$, $-SO_2-$, 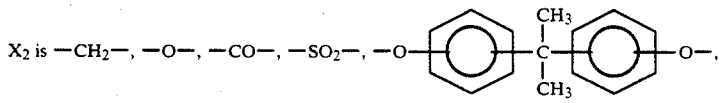
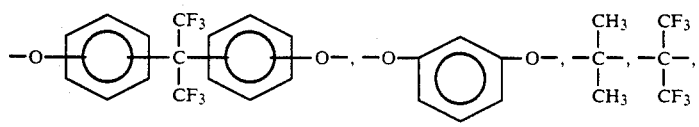
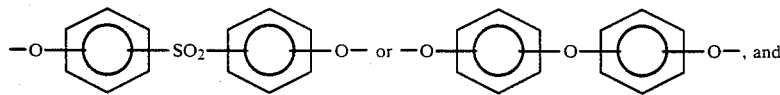
each $R_3$ and each $R_4$ are independently methyl, ethyl, propyl or phenyl, and
R is $-S-$ or $-SO_2-$.
49. The integrated circuit device as claimed in claim 41, wherein said heat-resistant resin (B) comprises a repeating unit selected from the group consisting of
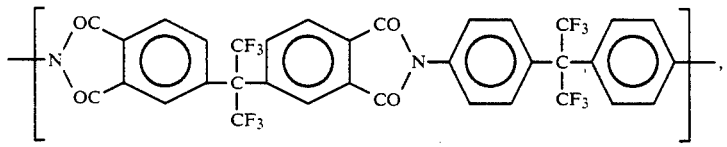
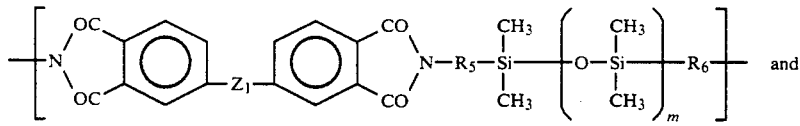
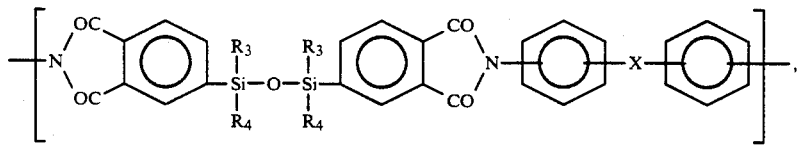
wherein
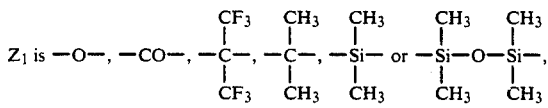
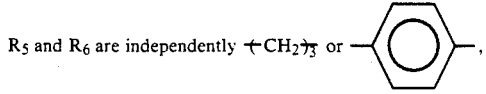
m is an integer having a value of from 1 to 100, X is —CH₂—, —O—, —CO—, —SO₂—,
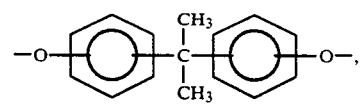
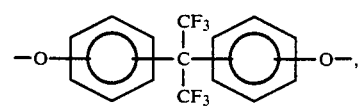
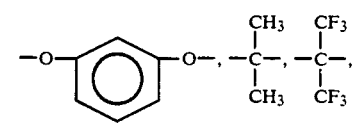
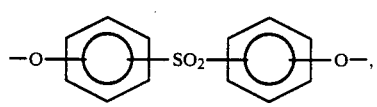
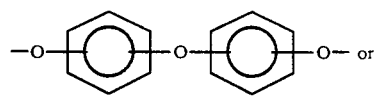
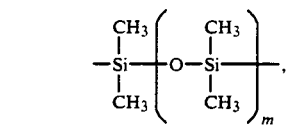
m being an integer having a value of from 1 to 100, and each $R_3$ and each $R_4$ are independently methyl, ethyl, propyl or phenyl,
and said fine particles of said heat-resistant resin (C) comprise a polyetheramide-imide having a repeating unit selected from the group consisting of
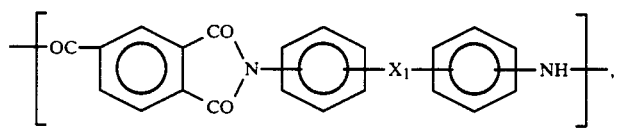
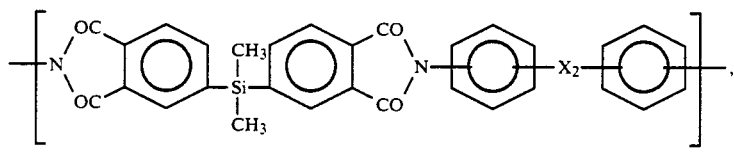
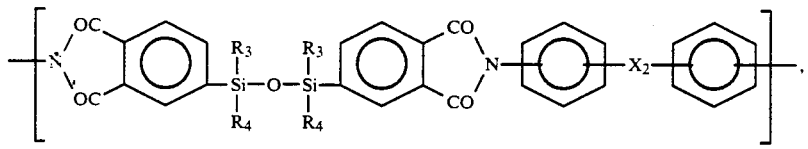
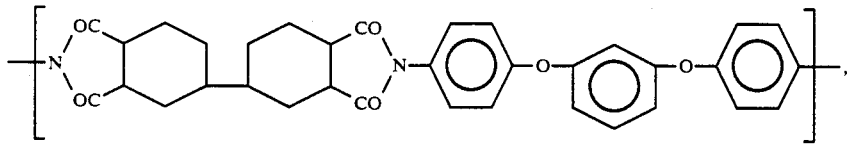
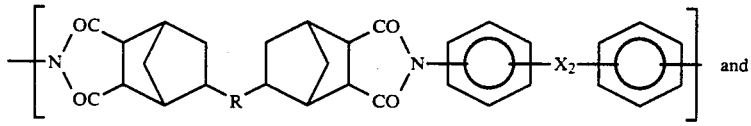 and
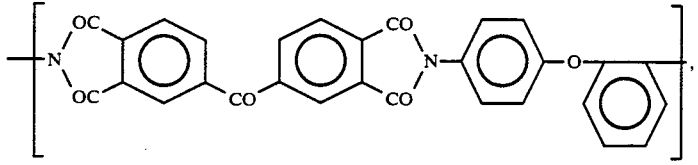
wherein $X_1$ is
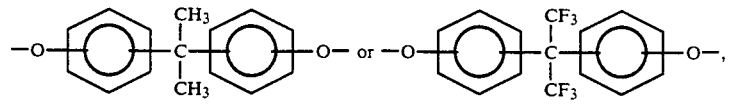

-continued

X₂ is —CH₂—, —O—, —CO—, —SO₂—,

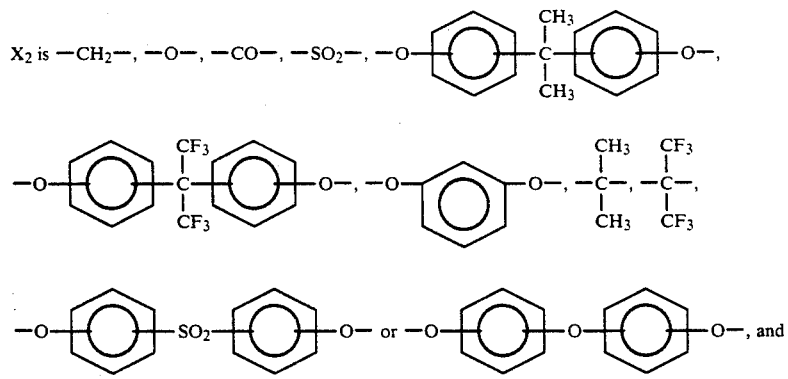

each R₃ and each R₄ are independently methyl ethyl, propyl or phenyl, and

R is —S— or —SO₂—.

50. The integrated circuit device as claimed in claim 25, wherein said (A₁) and said (A₂), are in a ratio of 30 (A₁):70 (A₂) to 70 (A₁):30 (A₂) in parts by weight, on the basis of the sum of said (A₁) and said (A₂) being 100 parts by weight and the heat-resistant resin (B) is in an amount of 5 to 70 parts by weight per 95 to 30 parts by weight of the fine particles of the heat-resistant resin (C) on the basis of the total of said (B) and said (C) being 100 parts by weight and the concentration of the sum of (C) and (B) being 10 to 90 weight %.

51. The integrated circuit device as claimed in claim 47, wherein said (A₁) and said (A₂), are in a ratio of 30 (A₁):70 (A₂) to 70 (A₁):30 (A₂) in parts by weight, on the basis of the sum of said (A₁) and said (A₂) being 100 parts by weight and the heat-resistant resin (B) is in an amount of 5 to 70 parts by weight per 95 to 30 parts by weight of the fine particles of the heat-resistant resin (C) on the basis of the total of said (B) and said (C) being 100 parts by weight and the concentration of the sum of (C) and (B) being 10 to 90 weight %.

52. The integrated circuit device as claimed in claim 35, wherein said (A₁) and said (A₂), are in a ratio of 30 (A₁):70 (A₂) to 70 (A₁):30 (A₂) in parts by weight, on the basis of the sum of said (A₁) and said (A₂) being 100 parts by weight and the heat-resistant resin (B) is in an amount of 5 to 70 parts by weight per 95 to 30 parts by weight of the fine particles of the heat-resistant resin (C) on the basis of the total of said (B) and said (C) being 100 parts by weight and the concentration of the sum of (C) and (B) being 10 to 90 weight %.

53. The integrated circuit device as claimed in claim 48, wherein said (A₁) and said (A₂), are in a ratio of 30 (A₁):70 (A₂) to 70 (A₁):30 (A₂) in parts by weight, on the basis of the sum of said (A₁) and said (A₂) being 100 parts by weight and the heat-resistant resin (B) is in an amount of 5 to 70 parts by weight per 95 to 30 parts by weight of the fine particles of the heat-resistant resin (C) on the basis of the total of said (B) and said (C) being 100 parts by weight and the concentration of the sum of (C) and (B) being 10 to 90 weight %.

54. The integrated circuit device as claimed in claim 45, wherein said (A₁) and said (A₂), are in a ratio of 30 (A₁):70 (A₂) to 70 (A₁):30 (A₂) in parts by weight, on the basis of the sum of said (A₁) and said (A₂) being 100 parts by weight and the heat-resistant resin (B) is in an amount of 5 to 70 parts by weight per 95 to 30 parts by weight of the fine particles of the heat-resistant resin (C) on the basis of the total of said (B) and said (C) being 100 parts by weight and the concentration of the sum of (C) and (B) being 10 to 90 weight %.

55. The integrated circuit device as claimed in claim 49, wherein said (A₁) and said (A₂), are in a ratio of 30 (A₁):70 (A₂) to 70 (A₁):30 (A₂) in parts by weight, on the basis of the sum of said (A₁) and said (A₂) being 100 parts by weight and the heat-resistant resin (B) is in an amount of 5 to 70 parts by weight per 95 to 30 parts by weight of the fine particles of the heat-resistant resin (C) on the basis of the total of said (B) and said (C) being 100 parts by weight and the concentration of the sum of (C) and (B) being 10 to 90 weight %.

* * * * *